(12) United States Patent
     Hellberg

(10) Patent No.: US 9,866,190 B2
(45) Date of Patent: Jan. 9, 2018

(54) MULTI-STAGE AMPLIFIERS WITH LOW LOSS

(71) Applicant: Telefonaktiebolaget LM Ericsson (publ), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/300,809

(22) PCT Filed: Apr. 3, 2014

(86) PCT No.: PCT/IB2014/060405
§ 371 (c)(1),
(2) Date: Sep. 30, 2016

(87) PCT Pub. No.: WO2015/150873
PCT Pub. Date: Oct. 8, 2015

(65) Prior Publication Data
US 2017/0026013 A1    Jan. 26, 2017

(51) Int. Cl.
*H03F 3/60* (2006.01)
*H03F 1/02* (2006.01)

(52) U.S. Cl.
CPC .......... *H03F 3/602* (2013.01); *H03F 1/0277* (2013.01); *H03F 1/0288* (2013.01);
(Continued)

(58) Field of Classification Search
CPC ....................................... H03F 3/602
(Continued)

(56) References Cited

U.S. PATENT DOCUMENTS 3,593,174 A    7/1971   White
4,631,492 A   12/1986   Magarshack et al.
(Continued)

FOREIGN PATENT DOCUMENTS

EP    2403135 A1    1/2012
WO    0205421 A1    1/2002
(Continued)

OTHER PUBLICATIONS

Chireix, H, "High Power Outphasing Modulation", Proceedings of the Institute of Radio Engineers, vol. 23, Issue 11, Nov. 1935, pp. 1370-1392.
(Continued)

*Primary Examiner* — Patricia T Nguyen
(74) *Attorney, Agent, or Firm* — Murphy, Bilak & Homiller, PLLC

(57) ABSTRACT

An amplifier circuit (100) comprises three amplifier subcircuits (121,131,141) connected via a network of transmission lines to a common node. A control circuit is configured to control the three amplifier subcircuits (121,131,141) to operate in first, second, and third operating modes, such that a first subcircuit (121) is active in the first, second, and third modes, a second sub-circuit (141) is inactive in the first mode but active in the second and third modes, and a third subcircuit (131) is inactive in the first and second modes but active in the third. A quarter-wavelength transmission line (170) couples the output node of the second sub circuit (141) to the output node (160) of the third subcircuit (131).

11 Claims, 26 Drawing Sheets

(52) U.S. Cl.
CPC ..... *H03F 1/0294* (2013.01); *H03F 2200/405* (2013.01); *H03F 2200/423* (2013.01)

(58) Field of Classification Search
USPC ........................................................ 330/286
See application file for complete search history.

(56) References Cited

U.S. PATENT DOCUMENTS

| | | | |
|---|---|---|---|
| 5,025,225 A | 6/1991 | Tajima et al. | |
| 5,543,751 A | 8/1996 | Stedman et al. | |
| 7,221,219 B2 | 5/2007 | Hellberg et al. | |
| 8,022,760 B2 | 9/2011 | Gajadharsing et al. | |
| 8,095,092 B2 * | 1/2012 | Muller | H03F 1/0261 330/277 |
| 8,737,527 B2 * | 5/2014 | Lozhkin | H03F 1/0277 375/295 |
| 2004/0263242 A1 * | 12/2004 | Hellberg | H03F 1/0294 330/2 |
| 2006/0192615 A1 | 8/2006 | Fraysse | |
| 2007/0080747 A1 * | 4/2007 | Klingberg | H03F 1/0294 330/124 R |
| 2009/0021301 A1 * | 1/2009 | Hellberg | H03F 1/0288 330/124 R |
| 2009/0163154 A1 * | 6/2009 | Fonden | H03F 1/0288 455/114.2 |
| 2011/0260771 A1 | 10/2011 | Hirota et al. | |
| 2012/0056669 A1 | 3/2012 | Fraysse et al. | |
| 2013/0154731 A1 | 6/2013 | Gajadharsing | |
| 2013/0321084 A1 | 12/2013 | Hellberg | |
| 2014/0118063 A1 * | 5/2014 | Briffa | H03F 1/32 330/124 R |

FOREIGN PATENT DOCUMENTS

| | | |
|---|---|---|
| WO | 03061115 A1 | 7/2003 |
| WO | 2004023647 A1 | 3/2004 |
| WO | 2004057755 A1 | 7/2004 |
| WO | 2005031966 A1 | 4/2005 |
| WO | 2010068152 A1 | 6/2010 |
| WO | 2014193275 A1 | 12/2014 |
| WO | 2014206501 A1 | 12/2014 |
| WO | 2014206502 A1 | 12/2014 |
| WO | 2015139745 A1 | 9/2015 |

OTHER PUBLICATIONS

Doherty, W. H., "A New High Efficiency Power Amplifier for Modulated Waves", Proceedings of the Institute of Radio Engineers, vol. 24, No. 9, Sep. 1936, pp. 1163-1182.

Raab, Frederick H., "Efficiency of Doherty RF Power-Amplifier Systems", IEEE Transactions on Broadcasting, vol. BC-33, No. 3, Sep. 1987, 77-83.

* cited by examiner

MULTI-STAGE AMPLIFIERS WITH LOW LOSS

TECHNICAL FIELD

The present invention relates generally to amplifier circuits and more particularly relates to multi-stage amplifier circuits.

BACKGROUND

Power amplifiers are often used to amplify wideband signals or combinations of signals with high peak-to-average-power ratio (PAR). The amplifiers in these applications must then be able to repeatedly output relatively high power for very short periods, even though the output power is generated at a much lower average power level for the bulk of the time. In systems where the amplified signal generally comprises a random phase combination of many signals, without any dominating signals, the amplitude of the signal follows a Rayleigh distribution.

A conventional single-transistor power amplifier (for example a class B, AB, or F power amplifier) has a fixed radio-frequency (RF) load resistance and a fixed voltage supply. The bias in class B or AB amplifiers causes the amplifier's output current to have a form close to that of a pulse train of half-wave-rectified sinusoidal current pulses. The direct-current (DC) current consumed by the amplifier is therefore largely proportional to the RF output current amplitude (and voltage amplitude). Because the supply voltage is fixed, the DC power consumed by the amplifier is also proportional to the RF output current amplitude. The output power delivered by the amplifier, however, is proportional to the square of the RF output current amplitude. The amplifier's efficiency, i.e., the output power divided by the DC power, is therefore also proportional to the output amplitude. Consequently, the average efficiency of a conventional power amplifier is low when amplifying signals that on average have a low output amplitude (or power) compared to the maximum required output amplitude (or power), i.e., in high PAR applications.

It is well known that the outputs from multiple sub-amplifiers (each sub-amplifier comprising a transistor plus surrounding circuitry) may be combined with a passive network so that the resulting amplifier circuit operates in a Doherty mode or a Chireix mode of operation. These amplifier circuits use multiple transistors that are configured and controlled to exploit a passive output network interaction and combination. Such power amplifiers are much more efficient than conventional amplifiers for amplitude-modulated signals that have a high PAR, since they have a much lower average sum of output currents from the amplifier transistors. It will be appreciated that such a reduced average output current leads to high average efficiency.

The reduced average output current is obtained by using two amplifier transistors that influence the output voltages and currents of each other through a reactive output network that couples the amplifier transistors to the load. By driving the constituent amplifier transistors with suitable amplitudes and phases, the sum of RF output currents can be reduced at all output levels below the maximum output power level for the combination. Also, for these amplifiers the RF voltage at one or both transistor outputs is increased. The reduced RF output currents are essentially obtained by providing for a high trans-impedance from at least one transistor to the circuit's output, while maintaining the possibility of in-phase combining of all transistor outputs to obtain full output power. This reduced average output current means higher average efficiency, since the DC current is largely proportional to the RF current magnitude.

The field was generalized for two-transistor structures, for example by "Unified High-Efficiency Amplifiers", published as International Patent Application WO 2003061115 A1 by the present Applicant. This publication discloses a two-stage high-efficiency amplifier with increased robustness against circuit variations, which can avoid tuning of the output network while providing for a radically increased bandwidth of high efficiency. This two-stage amplifier circuit includes a longer and a shorter transmission line respectively connecting the outputs of two amplifier transistors to a common output node, which in turn is coupled to a load, $R_{LOAD}$. If the most wideband operation is desired, the lengths of the transmission lines are chosen such that the longer line has an electrical length of half a wavelength at center frequency, while the shorter line has an electrical length of a quarter wavelength at a nominal operating frequency for the circuit, e.g., at a center frequency of the operating band. The basic structure of such an amplifier is shown in FIG. 1.

The amplifier circuit 10 illustrated in FIG. 1 comprises a first amplifier 5 located in a first or "main" branch 1 of the amplifier circuit 10 and a second amplifier 6 located in a second or "auxiliary" branch 3 of the amplifier circuit 10. An output of the first amplifier 5 and an output of the second amplifier 6 are coupled to a common output 9 via respective first and second transmission lines 7 and 8. As mentioned above, the first and second transmission lines 7, 8 form a reactive output network that influences the operation of the first and second amplifiers 5, 6. The electrical length of the first transmission line 7 can be designed to be shorter than the electrical length of the second transmission line 8 (for example a quarter wavelength and a half wavelength, respectively, at a center frequency, as shown). In operation, an input signal 4 is received by the amplifier circuit 10, split by a signal component separator 2 and amplified by the first amplifier 5 and the second amplifier 6.

Amplifier circuit 10 has a wide bandwidth of high efficiency since the shorter/longer transmission lines 7, 8 of the output network interact with the transistors to form different kinds of amplifiers at different frequencies. Around a center frequency of operation the amplifier circuit 10 operates as a Doherty amplifier, and at ⅔ and ⁴⁄₃ of that frequency the amplifier circuit 10 operates as a Chireix amplifier. A very wide (about 3 to 1) high-efficiency bandwidth is thus achieved in such an amplifier circuit 10 by devising an output network that has both suitable impedance transformation characteristics and full power output capacity over a wide bandwidth, together with a unified control system that allows high efficiency operation at all "modes" across that bandwidth. The amplifier circuit 10 of FIG. 1 therefore allows operation in between and outside the intrinsically narrowband Doherty and Chireix modes.

Further developments of the type of circuit shown in FIG. 1 include three basic expandable multi-transistor structures (and ways to drive them efficiently), such as those disclosed by the present applicant in U.S. Pat. No. 7,221,219, the entire contents of which are incorporated herein by reference. Amplifiers such as these, based on passive output network interaction structures, have the advantage of needing only basic RF network and signal modifications.

The reduced average output currents mentioned above also come with a drawback. The RF voltage swing at some transistors is increased, often to the maximum possible. This makes the amplifiers sensitive to resistive losses in a shunt path at the outputs of the transistors, i.e., between the drain and ground, since the loss power is proportional to the RF voltage swing squared. The most common causes of shunt loss are the small series resistance of the capacitance at the drain node, or coupling to a lossy substrate via the drain capacitance (Cds). These capacitively coupled losses often increase almost quadratically with frequency.

Another approach to improving the efficiency of a power amplifier is referred to as peak power reduction. This approach includes any of several techniques such as clipping, crest factor reduction (CFR), etc., which operate to reduce the peak power of a signal to be transmitted. With conventional single-transistor amplifiers this consequentially increases efficiency. Contrarily, multi-transistor amplifiers such as those described above can, with proper dimensioning, have efficiency almost independent of PAR.

Peak power reduction methods can in some systems reduce the peak power greatly, but while doing so they increase the noise level (EVM) in the signal. This decreases the signal to noise ratio, SNR, of the signal at the receiver, and will thus require a boost in average signal power to compensate for this. This increase in average power will increase both the DC power drawn and the power loss in the amplifier. For example, a commonly found compensatory 1-dB increase in average power increases the DC power drawn by 25% and thus decreases the "equivalent efficiency" to only 80% of the measured efficiency.

It is therefore beneficial to the system to use as little peak power reduction as possible. The ideal solution would be to have the possibility of high peak output power to cope with the peaks of high-PAR signals, while at the same time having high efficiency around the average power level.

Chireix-Doherty amplifiers have the potential of very high average efficiency for signals with high PAR. To achieve this, however, the transistors should have low shunt loss, i.e., a low resistive loss between the drain and ground nodes. Such transistors are generally more expensive than transistors with high loss. As mentioned above, the most common causes of shunt loss is the series resistance of the capacitance at the drain node, or coupling to a lossy substrate via the drain capacitance (Cds).

SUMMARY

Several of the techniques and circuits disclosed herein may be used to obviate or reduce at least one or more of the disadvantages mentioned above, for example by allowing the peak power to be increased while retaining average efficiency at a low cost.

Embodiments of the invention include multi-stage amplifier circuits that include three amplifier subcircuits, where at least one of the amplifier subcircuits is a Chireix pair. The output nodes of these three amplifier subcircuits are connected, via a network of transmission lines, to a common output node. The multi-stage amplifier circuit further includes a signal generation circuit configured to provide input signals to the three amplifier subcircuits so that the amplifier subcircuits operate in first, second, and third operating modes, as a function of a desired output power at the common node, such that a first one of the amplifier subcircuits is active in all three operating modes, a second one of the amplifier subcircuits is inactive in the first operating mode and active in the second and third modes, and the remaining amplifier subcircuit is inactive in the first and second modes and active in the third. A transmission line segment having an electrical length of approximately one-quarter wavelength (or any odd multiple thereof) at an operating frequency of the multi-stage amplifier couples either the output node of the first amplifier subcircuit or the output node of the second amplifier subcircuit to the output node of the third amplifier subcircuit. The output node of the remaining one of the first and second amplifiers circuits is coupled to a point between the common node and the output node of the third amplifier subcircuit but electrically distant from the output node of the third amplifier subcircuit.

Other embodiments include methods suitable for implementation in a multi-stage amplifier circuit comprising three amplifier subcircuits having respective output nodes connected via a network of transmission lines to a common output node, where at least one of the three amplifier subcircuits comprises a Chireix pair. An example method according to these embodiments includes amplifying a first input signal, using the first amplifier subcircuit, in each of first, second, and third operating modes. The example method further includes amplifying a second input signal, using the second amplifier subcircuit, in the second and third operating modes, but deactivating the second amplifier subcircuit in the first operating mode, and amplifying a third input signal, using the third amplifier subcircuit, in the third operating mode, but deactivating the third amplifier subcircuit in the first and second operating modes. The example method further comprises coupling either the output node of the first amplifier subcircuit or the output node of the second amplifier subcircuit to the output node of the third amplifier subcircuit via a transmission line segment having an electrical length approximately equal to an odd multiple of one-quarter wavelength at an operating frequency of the multi-stage amplifier, and coupling the output node of the remaining one of the first and second amplifiers circuits to a point between the common output node and the output node of the third amplifier subcircuit but electrically distant from the output node of the third amplifier subcircuit.

BRIEF DESCRIPTION OF THE DRAWINGS

For a better understanding of the presently disclosed techniques, and to show more clearly how they may be carried into effect, reference will now be made, by way of example only, to the following drawings in which.

DETAILED DESCRIPTION

The several embodiments described below provide a new type of multi-stage amplifier arrangement that is aimed at being more efficient when operating with Chireix-Doherty behavior. The amplifier arrangements according to several embodiments of the present invention provide a peak amplifier for handling peak output power levels while also providing, at low output power levels, low sensitivity to any shunt loss in the peak amplifier.

More particularly, and as will be described in greater detail below, the embodiments described herein include new types of amplifiers with Chireix-Doherty-Doherty, Doherty-Chireix-Doherty and Doherty-Doherty-Chireix behavior, which at low output power levels have low sensitivity to shunt loss at the output of the transistor for the peaking sub-amplifier. This is achieved through circuit arrangements that ensure that the RF voltage swing at the peak amplifier is very low when output power levels are low, which as a consequence means that the shunt loss resistance of the peak amplifier only draws a small RF current. This has the advantage that the peak amplifier can thus be both large and use a cheaper transistor technology. As detailed below, these new amplifier circuits can be realized in several ways.

As noted above, amplifier circuits having multiple amplifier subcircuits have been developed, with an aim for efficient multi-stage operation in applications where the amplified signals have a high peak-to-average-power ratio (PAR). The Doherty and Chireix amplifier configurations are well known; each of these amplifier configurations employs at least two amplifier subcircuits.

The multi-amplifier concept can be extended beyond the two-amplifier-subcircuit case. These multi-amplifier circuits can combine different modes of operation—for instance, a Doherty mode of operation can be combined with a Chireix mode of operation in amplifier circuits having three or more amplifier subcircuits.

Figure 1:
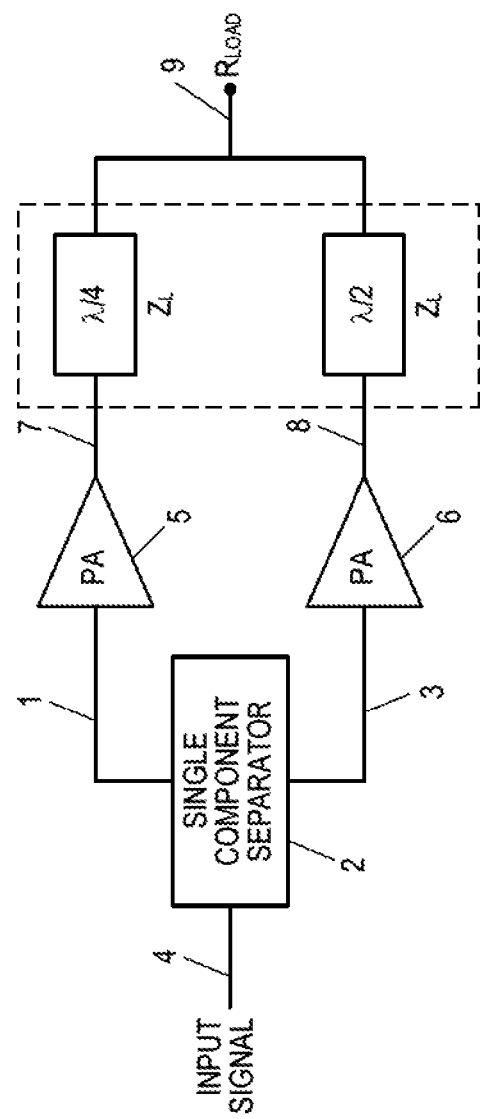
FIG. 1 shows an amplifier circuit according to the prior art.
Figure 2:
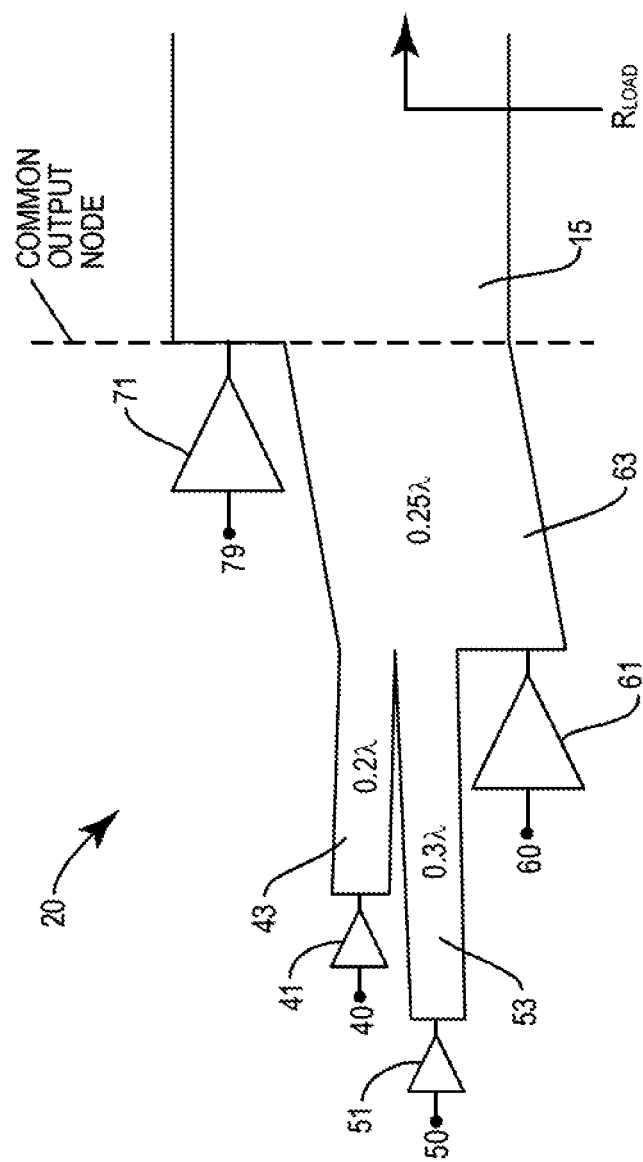
FIG. 2 shows an example of a multi-stage Chireix-Doherty-Doherty amplifier circuit.

FIG. 2 illustrates an example of a four-stage amplifier circuit 20, which may be referred to as a Chireix-Doherty-Doherty amplifier. The naming convention here is based on the order of the Chireix and Doherty behaviors, from low amplitudes to high amplitudes.

Amplifier circuit 20 comprises four amplifier subcircuits 40, 50, 60, and 70, which are fed by respective input signals 41, 51, 61, and 71. Each of the amplifier subcircuits comprises a transistor (or multiple transistors) and appropriate surrounding circuitry.

Figure 3B:
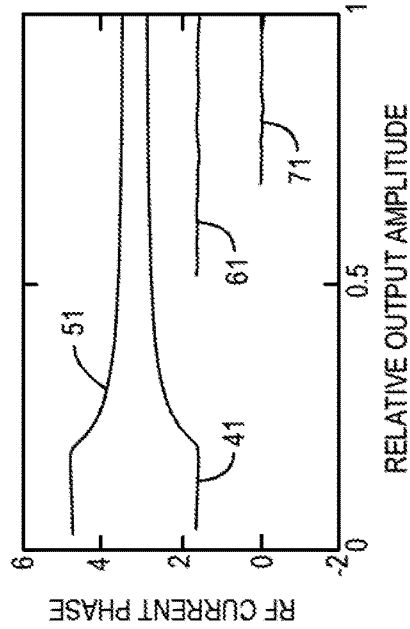
FIGS. 3A-3D illustrate the behaviors of currents and voltages for the circuit of FIG. 2.
Figure 3D:
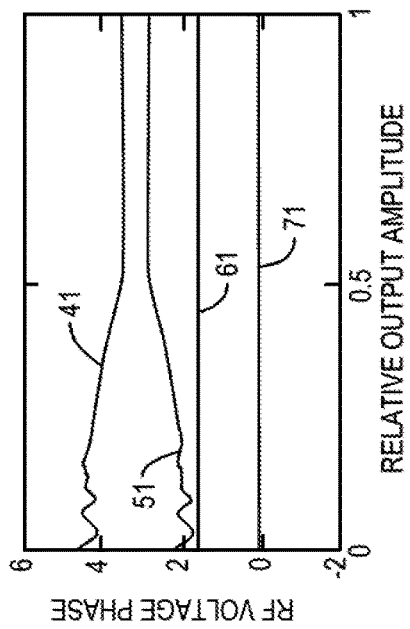
Figure 3A:
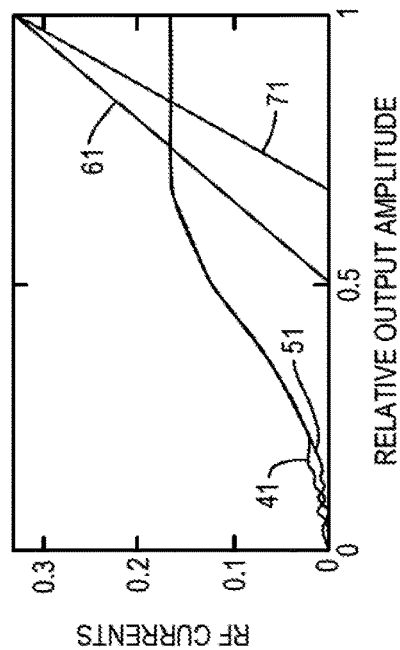

First and second amplifier subcircuits 40 and 50 feed transmission line sections 43 and 53, respectively; transmission line sections 43 and 53 are joined together distant from the outputs of amplifiers 41 and 51. Notably, the lengths of transmission line sections 43 and 53 together are approximately equal to one-half of the wavelength of a nominal operating frequency for the amplifier circuit 20, e.g., a center frequency of an operating bandwidth for the circuit. This allows amplifiers 41 and 51 to be operated as a Chireix pair at low output signal amplitudes, e.g., at output signal amplitudes from 0 to about 0.2 times the maximum output amplitude of amplifier circuit 20. This can be seen in FIGS. 3A and 3B, which show the output radio-frequency (RF) current amplitudes and phases for each amplifier circuit. As seen in FIGS. 3A and 3B, the output amplitudes of amplifiers 41 and 51 increase linearly from relative output amplitudes of 0 to about 0.2, while the difference between their output phases remains constant. The upper boundary of this region is determined by the size of the reactances, X, or equivalently, by the difference δ in line lengths between transmission line sections 43 and 53. This parameter may be chosen so that the average efficiency is maximized for the signal amplitude distribution used, by placing the lowermost efficiency maximum at an output amplitude point below the average signal amplitude.

Figure 3C:
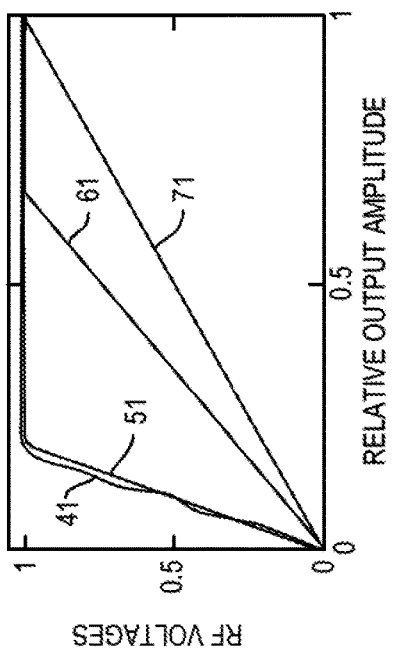

At medium output amplitudes, e.g., from a relative output amplitude of about 0.2 to about 0.5, amplifiers 41 and 51 are operated in an out-phasing mode in a range of amplitudes extending from a relative amplitude of about 0.2 to about 0.5 (referenced to the output of the entire amplifier circuit). In this range, amplifiers 41 and 51 are driven so as to produce constant output voltage amplitudes and varying relative phases of their output node voltages, as seen in FIGS. 3C and 3D. The upper boundary of this second region is determined by the relation between the sum of the maximum output powers of the first and second amplifiers 41 and 51 to the sum of all four amplifiers' maximum output power.

At higher output amplitudes, e.g., in a relative output amplitude range from about 0.5 to 0.7, the first and second amplifiers 41 and 51 are held at constant voltage and constant phase difference while together supplying a linearly increasing output current. In this region a third amplifier 61 is also active, supplying a linearly increasing current starting from zero. In a fourth region, extending from relative amplitudes of about 0.7 to 1.0, a peaking amplifier 71 is activated, supplying a linearly increasing current starting from zero.

Figure 4:
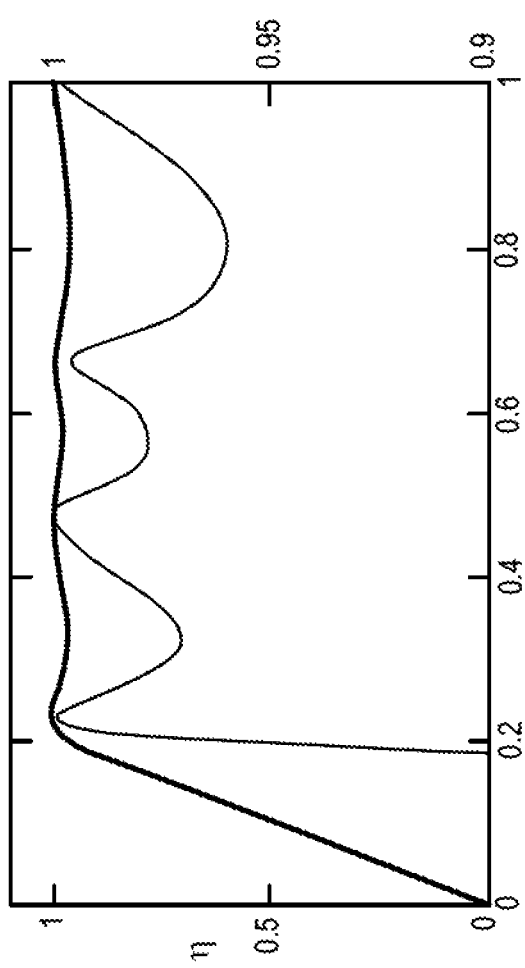
FIG. 4 shows an example efficiency curve for the amplifier circuit of FIG. 2.

FIG. 4 illustrates example efficiency curves for the circuit configuration of FIG. 2. The bold curve illustrates the full range of efficiency from 0 to 1 (100%), while the other curve shows the top of the efficiency curve at 10-times the scale, i.e., in a range from 0.9 to 1.0.

Chireix-Doherty-Doherty, Doherty-Chireix-Doherty, and other similar 4-stage (and higher) amplifiers have the potential of very high average efficiencies for signals with high PAR. To achieve this, however, the transistors, should have low shunt losses, i.e., low resistive losses between the transistor drain and ground nodes. This is because there are non-zero voltages at the output of the peaking amplifier subcircuits even at low relative amplitude levels for the circuit. This can be seen in FIG. 3C, which shows that there are significant RF voltages at the output of amplifiers 61 and 71 at a relative output amplitude of 0.5, where neither amplifier is contributing any current to the output signal.

A problem with multi-stage amplifiers is thus how to substantially increase the peak power with retained average efficiency and low cost. While Gallium Nitride (GaN) amplifiers, for example, exhibit very low shunt losses, they are relatively expensive. Silicon (Si)-based amplifiers have much higher shunt losses, but are much cheaper than GaN amplifiers having comparable output powers. With a four-stage amplifier like that shown in FIG. 2, the more expensive, low-shunt-loss transistors must be used to maintain the highest possible efficiencies at lower output amplitudes. Since the average output amplitude for a signal with high PAR is relatively low, this means that the average efficiencies of such amplifier circuits would suffer if peaking amplifiers with higher shunt losses were used.

Accordingly, there is a strong need for multi-stage amplifier circuits that have relatively low output voltages at the peaking amplifier outputs, for relatively low output amplitudes of the circuits.

Figure 5:
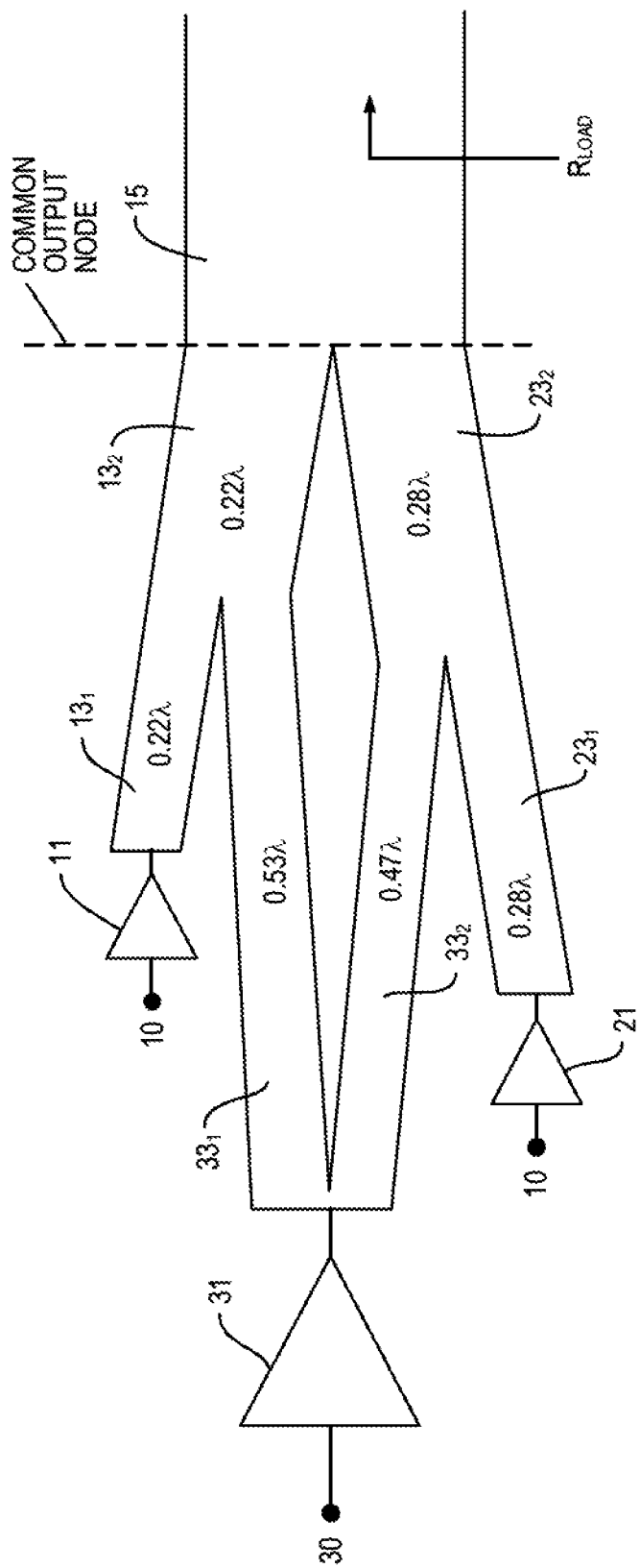
FIG. 5 illustrates a multi-stage Chireix-Doherty-Doherty amplifier circuit that facilitates the use of a relatively high-shunt-loss transistor amplifier for the peaking amplifier subcircuit.

FIG. 5 illustrates an example of one approach by which this can be achieved. In the illustrated circuit, three amplifier subcircuits, power amplifiers (PAs) 11, 21, and 31, are used. Importantly, the auxiliary amplifier 31, which may be considerably larger (i.e., capable of delivering higher power) than amplifiers 11 and 21, is coupled to the common output node via an auxiliary transmission line network comprising two transmission line segments $33_1$ and $33_2$ that split the output from amplifier 31 in two and join to the midpoints of transmission line segments coupling the outputs of amplifiers 11 and 21 to the common output node.

The amplifier circuit 100 shown in FIG. 5 comprises a first amplifier 11 configured to amplify a first input signal 10. An output of the first amplifier 11 is coupled to an output node 15 via a first transmission line 13. The first transmission line 13 comprises a first portion $13_1$ having a first characteristic impedance and a length equal to about $0.22\lambda$, where $\lambda$ is the wavelength of a signal at a nominal operating frequency, e.g., at a center frequency of an operating bandwidth. The first transmission line has a second portion $13_2$ having a second characteristic impedance and a second length also equal to about $0.22\lambda$.

The amplifier circuit 100 also comprises a second amplifier 21 configured to amplify a second input signal 20. An output of the second amplifier 21 is coupled to the output node 15 via a second transmission line 23. The second transmission line 23 comprises a first portion $23_1$ having a first characteristic impedance and a length equal to about $0.28\lambda$, and a second portion $23_2$ having a second characteristic impedance and a second length also equal to about $0.28\lambda$.

The amplifier circuit 100 also comprises an auxiliary amplifier 31 (also referred to herein as a peak amplifier) configured to amplify a third input signal 30. An output of the auxiliary amplifier 31 is coupled via an auxiliary transmission line network ($33_1$, $33_2$) to a first intersection between the first and second portions $13_1$, $13_2$ of the first transmission line 13, and to a second intersection between the first and second portions $23_1$, $23_2$ of the second transmission line 23. In the circuit of FIG. 4, the length of the first auxiliary transmission line $33_1$ is longer than the length of the second auxiliary transmission line $33_2$. In particular, the length of the first auxiliary transmission line $33_1$ and second auxiliary transmission line $33_2$ are an equal predetermined length longer and shorter, respectively, than N times a quarter wavelength. For example, in the embodiment of FIG. 4 the first auxiliary transmission line $33_1$ has a length of $0.53\lambda$ and the second auxiliary transmission line $33_2$ a length of $0.47\lambda$.

By arranging the amplifier circuit in this way, the output network can be configured such that the auxiliary amplifier 31 is able to perform the same task as in a prior art Chireix-Doherty amplifier circuit in the upper part of the amplitude range, but having lower RF voltage swing in the low amplitude range (i.e., when the first and second amplifiers 11, 21 are operating as a Chireix pair). This enables a lower quality/cost amplifier to be used as the auxiliary amplifier 31, without having the disadvantages associated with prior art systems The lengths and/or characteristic impedances of the first and second transmission lines 13, 23 and the auxiliary transmission line network $33_1$, $33_2$ are configured such that, during use, a low voltage swing is experienced by the auxiliary amplifier 31 for output signals having a low amplitude range.

Operation of the three-amplifier system shown in FIG. 5 can be subdivided into three main regions. At low output amplitudes, the first and second amplifiers 11, 21 are driven in a Chireix mode, to supply linearly increasing output current amplitudes with a constant phase angle between the output currents. The upper boundary of this region is determined by the size of the reactances, X, or equivalently, by the line length difference, δ. This parameter may be chosen so that the average efficiency is maximized for the signal amplitude distribution used, by placing the lowermost efficiency maximum at an output amplitude point corresponding to the average signal amplitude.

At medium output amplitudes, the first and second amplifiers 11, 21 are driven in an out-phasing fashion, with constant output amplitudes and varying relative phases of their output node voltages. The upper boundary of the middle region is determined by the relation between the sum of the maximum output powers of the first and second amplifiers 11, 21 to the sum of all three amplifiers' maximum output power. At high output amplitudes, the first and second amplifiers are held at constant voltage and constant phase difference while together supplying a linearly increasing output current. In this region the third amplifier 31 is also active, supplying a linearly increasing current starting from zero.

In the circuit shown in FIG. 5, the length of the first portion $13_1$ of the first transmission line 13 is substantially equal to the length of the second portion $13_2$ of the first transmission line 13, and the length of the first portion $23_1$ of the second transmission line 23 is substantially equal to the length of the second portion $23_2$ of the second transmission line 23. More particularly, the first and second portions $13_1$, $13_2$ of the first transmission line 13 are shown in this example as having substantially equal lengths of $0.22\lambda$, while the first and second portions $23_1$, $23_2$ of the second transmission line 23 are shown as having substantially equal lengths of 0.28λ. By making the lengths of the first and second portions substantially equal, this has the benefit that, together with the effect of the other line lengths and drive signals, the third amplifier 31 receives a low RF voltage, while the first and second amplifiers 11 and 21 operate as a Chireix pair, at low output amplitudes.

The particular circuit shown in FIG. 5 is also configured such that the first and/or second portions $13_1$, $13_2$ of the first transmission line 13 are a first predetermined length Δ1 shorter than an odd multiple of a quarter wavelength, and wherein the first and/or second portions $23_1$, $23_2$ of the second transmission line are a second predetermined length Δ2 longer than an odd multiple of a quarter wavelength. In the illustrated example, the first and second portions $13_1$, $13_2$ of the first transmission line 13 are a first predetermined length Δ1=0.03λ shorter than a quarter wavelength (i.e. 0.25λ−0.03λ=0.22λ), with the first and second portions $23_1$, $23_2$ of the second transmission line 23 being a second predetermined length Δ2=0.03λ longer than a quarter wavelength (i.e. 0.25λ+0.03λ=0.28λ). In the example shown in FIG. 5, the first predetermined length Δ1 is substantially equal to the second predetermined length Δ2, i.e. 0.03λ in the example. By making one transmission line shorter and one transmission line longer than a quarter length (or multiple thereof), this has the benefit that, together with the effect of the other line lengths and drive signals, the third amplifier 31 receives a low RF voltage, while the first and second amplifiers 11 and 21 operate as a Chireix pair, at low output amplitudes.

It is noted that the size of the electrical length differences Δ1 and 42 determines the efficiency at low outputs and correspondingly the amplitude where "out-phasing" starts, as explained more fully below. Circuits according to the general configuration shown in FIG. 5 and having equal amounts of lengthening/shortening have the advantage of providing symmetric Chireix operation, which can simplify drive signal generation. Circuits having unequal amounts of lengthening and shortening can provide higher average efficiency, but with more complex drive signal generation.

It can also be seen in FIG. 5 that the first auxiliary transmission line $33_1$ is longer, and the second auxiliary transmission line $33_2$ shorter, than a half wavelength (i.e. 0.5λ) by a substantially equal amount (i.e., longer and shorter by 0.03λ respectively). It can be seen from this example that the 0.03 value is the same as the value for the first and second transmission lines. This ensures that the total transmission line length from the third amplifier 31 to the common output node is the same for both the upper path and the lower path. At full output, the split waves from amplifier 31 will then combine at the output in phase. In-phase addition of the output signals from the other two other amplifiers 11, 21 is achieved by adjusting the phases of their input signals relative that of the third amplifier 31. It is noted that a small mismatch does not provide problems in practice since it only gives a small reduction in maximum output power.

Referring once again to FIG. 5, it will be appreciated that the characteristic impedances of the various transmission line segments vary. More particularly, the characteristic impedance of the first portion $13_1$ of the first transmission line 13 is substantially N times the characteristic impedance of the second portion $13_2$ of the first transmission line 13. For example, in the circuit shown in FIG. 5, the characteristic impedance of the first portion $13_1$ of the first transmission line 13 is substantially twice the characteristic impedance of the second portion $13_2$ of the first transmission line 13. This is illustrated in a general manner by the respective thicknesses of the first and second portions $13_1$, $13_2$ in FIG. 5. Likewise, the characteristic impedance of the first portion $23_1$ of the second transmission line 23 is substantially N times the characteristic impedance of the second portion $23_2$ of the second transmission line 23. For example, in the embodiment of FIG. 5 the characteristic impedance of the first portion $23_1$ of the second transmission line 23 is substantially twice the characteristic impedance of the second portion $23_2$ of the second transmission line 23.

It can therefore be seen that the characteristic impedances of the second portions $13_2$, $23_2$ of the first and second transmission lines 13, 23 are substantially N times the characteristic impedance of a load impedance $R_{LOAD}$ of the output node 15. For example, the characteristic impedances of the second portions $13_2$, $23_2$ of the first and second transmission lines 13, 23 may be substantially twice the characteristic impedance of the load impedance of the output node 15 (again indicated generally by the respective thicknesses of the second portions $13_2$, $23_2$ of the first and second transmission lines 13, 23 compared to the load impedance at the output node 15).

It is noted, however, that the characteristic impedances can be any multiple of one another, or any relationship. An advantage can be obtained by making both transistors of the Chireix pair (i.e., the first and second amplifiers 11, 21) of equal size, with equal transmission line impedances coupling these amplifiers to the rest of the circuit. The third transistor 31 and its transmission lines can have any relation to these, in theory, but due to the limited number of transistor sizes of a specific technology, from a practical viewpoint an embodiment can have a relationship which provides multiples of small numbers (such as 1 or 2). As such, a 1-1-2 size relation between the first, second and third amplifiers, as provided in the example, has been found to work well with typical signal amplitude distributions. It is noted, however, that if different technologies are used for the various amplifiers, such as Chireix pair transistors (GaN, GaAs) for the first and second amplifiers, and a peaking transistor (Si) for the third amplifier, then whole number relations could be the exception, rather than the rule.

In the pictured circuit, the characteristic impedance of the first and second auxiliary transmission lines $33_1$, $33_2$ are substantially equal. In some cases, the characteristic impedance of the first and second auxiliary transmission lines $33_1$, $33_2$ may be substantially equal to the characteristic impedance of the first portions $13_1$, $23_1$ of the first and second transmission lines 13, 23.

In summary, in the circuit shown in FIG. 5, the first component amplifier 11 (fed by input signal 10) is connected by a first portion $13_1$ of a first transmission line 13 of length 0.22λ to a second portion $13_2$ of the first transmission line 13, of substantially equal length 0.22λ, wherein the second portion $13_2$ is of lower characteristic impedance compared to the first portion 13 (for example halved, illustrated by a doubling of the line width). This wider second portion $13_2$ is connected to a common output load, illustrated by a transmission line of characteristic impedance $R_{LOAD}$ continuing indefinitely to the right. To the junction where the wider transmission line starts (i.e. the intersection between the first and second portions $13_1$, $13_2$ of the first transmission line 13) is also connected an auxiliary transmission line $33_1$ of length 0.53λ, that originates at the output of the auxiliary amplifier 31. The narrower lines of the transmission lines each have a characteristic impedance of four times $R_{LOAD}$ and the wider line has a characteristic impedance of two times $R_{LOAD}$. It is noted that other multiples or ratios may be used.

The second component amplifier 20 is connected by a first portion 23₁ of the second transmission line 23 of length 0.28λ to a second portion 23₂ of the second transmission line 23 of lower characteristic impedance, also of length 0.28λ, which in turn is connected to the common output 15. To the junction where the wider transmission line starts (i.e. the intersection between the first and second portions 23₁, 23₂ of the second transmission line 23) is also connected a second auxiliary transmission line 33₂ of length 0.47λ, that originates at the output of the auxiliary amplifier 31. Also here the narrower lines have characteristic impedances of 4 times $R_{load}$ and the wider line has a characteristic impedance of 2 times $R_{LOAD}$.

In the output interaction network shown in the embodiment of FIG. 5, the first and second amplifiers 11 and 21 form a Chireix pair that operates largely by itself at low output amplitudes, providing substantially all of the output power while consuming very little DC power. The auxiliary amplifier 31 has the function of providing output power only in the high output power range (for example up to half of the output power at full output), and absorbs very little RF power in the low range, due to the low RF voltage swing resulting from the configuration of the output interaction network.

It can be seen that in the circuit of FIG. 5, the Chireix pair branches, i.e. the first and second transmission lines 13, 23, each consist of a higher-impedance and a lower-impedance transmission line of equal length. These transmission lines are slightly shorter than a quarter wavelength for one branch, the first transmission line 13, and equally longer for the other, the second transmission line 23. The auxiliary (peak) transistor 31 is connected directly to both branches to junctions substantially midpoint, with the branches having lengths slightly longer and shorter than a half wavelength (or zero, or other multiples of a half) by the same amount. It will also be noted that the total lengths from the auxiliary amplifier 31 to the output node 15, through both its paths, are substantially equal to a three quarter (or one quarter, or other odd multiples of a quarter) wavelengths.

Figure 6:
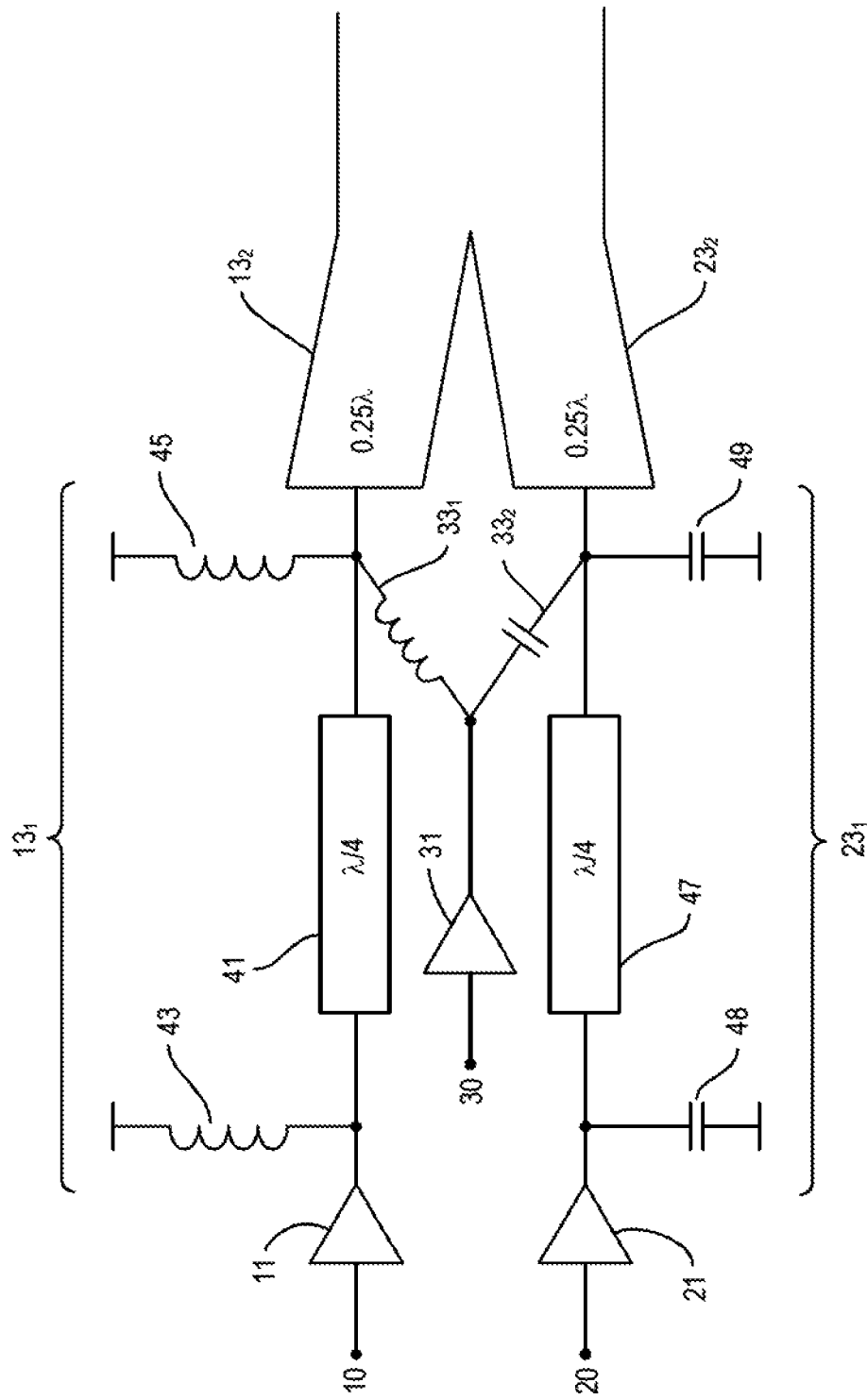
FIG. 6 illustrates a multi-stage Chireix-Doherty-Doherty amplifier corresponding to that of FIG. 5 but with lumped elements substituting for and/or modifying transmission line segments.

It should be appreciated that equivalent circuits may be used to realize one or more parts of the arrangement of FIG. 5, as well as of any of the circuits illustrated herein. FIG. 6 shows one example of an embodiment whereby the first portion 13₁ of the first transmission line 13 of FIG. 5 is shown as being realized using a quarter wave line 41 that is effectively shortened using one or more shunt inductors 43, 45. The second portion 13₂ of the first transmission line 13 of FIG. 5 may also be realized in this way (or indeed by any other equivalent circuit that achieves the same result). Further, in FIG. 6, the first portion 23₁ of the second transmission line 23 of FIG. 5 is shown as being realized using a quarter wave line 47 that is effectively lengthened using one or more shunt capacitors 48, 49. The second portion 23₂ of the second transmission line 23 of FIG. 6 may also be realised in this way (or indeed by any other equivalent circuit that achieves the same result). Thus, FIG. 6 describes an alternative circuit to the embodiment of FIG. 5 where the transmission lines can be made from quarter-wavelength lines only, with the quarter-wavelength lines being shortened/lengthened respectively using inductors and capacitors. This has the advantage in that only one length of transmission line needs to be used.

In a similar manner, the auxiliary transmission lines from the auxiliary (or peak) amplifier 31, being close to 0.5 wavelengths, can be replaced by a series capacitor for the shortened line, and a series inductor for the lengthened line.

As used in the description that follows, then, the term "transmission line" should be understood to refer to any distributed radio-frequency transmission line (e.g., a microstrip, stripline, coplanar waveguide, or the like) or to any lumped-element equivalent of such transmission lines, as well as to a combination of distributed and lumped elements that perform the same function.

Figure 7A:
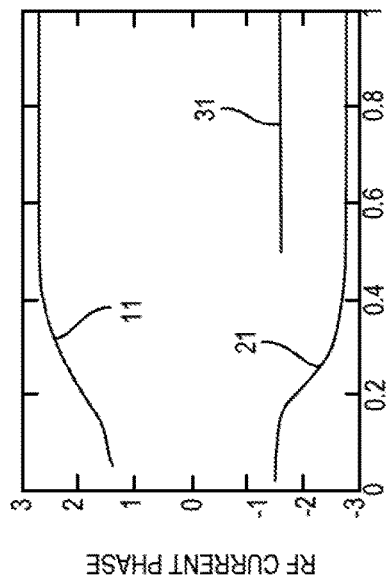
FIGS. 7A-7D illustrate the behaviors of currents and voltages for the circuits of FIGS. 5 and 6.
Figure 7B:
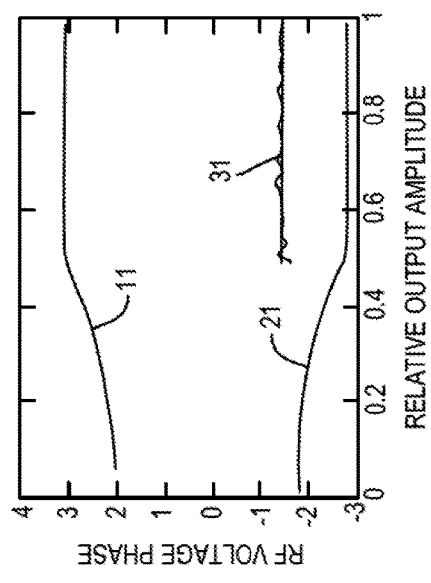

FIGS. 7a to 7d illustrate the behaviors of the RF currents and voltages at the amplifiers for the first described transmission-line-only circuit of FIG. 5. More particularly, FIG. 7a shows the RF current amplitudes for amplifiers 11, 21 and 31, while FIG. 7b shows the current phases (relative to the phase of the output signal), for amplifiers 11, 21 and 31. The three stages of operation can be seen quite clearly in FIGS. 7a and 7b, which show that amplifiers 11, 21 are operated as a Chireix pair at low amplitudes (relative amplitudes of 0 to about 0.2, and are transitioned to an out-phasing mode in a range of amplitudes extending from a relative amplitude of about 0.2 to about 0.5. Above a relative amplitude of about 0.5, auxiliary amplifier 31 is turned on gradually, operating as a Doherty peaking amplifier.

Figure 7C:
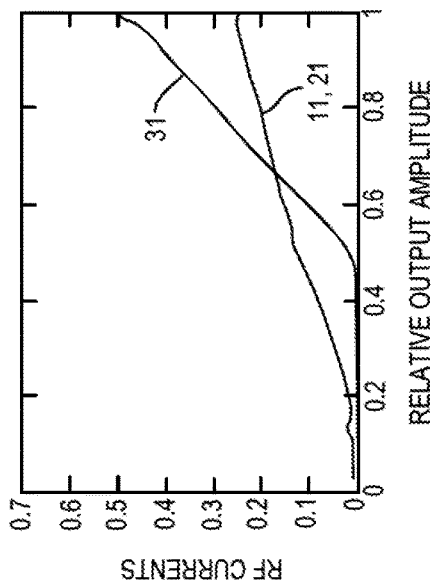
Figure 7D:
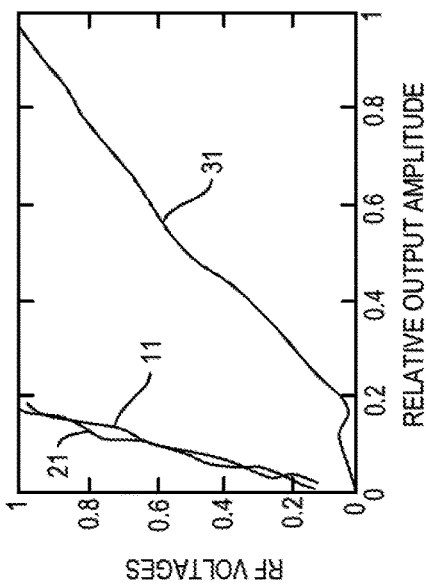

FIG. 7c shows RF voltage amplitudes for amplifiers 11, 21 and 31. It can be seen that there is a very low RF voltage swing at the auxiliary amplifier 31 in the low amplitude region. This minimizes any losses due to shunt resistance in the auxiliary amplifier 31. FIG. 7d shows RF voltage phases (thick) and RF current phases (thin lines), for amplifiers 11, 21 and 31.

Figure 8:
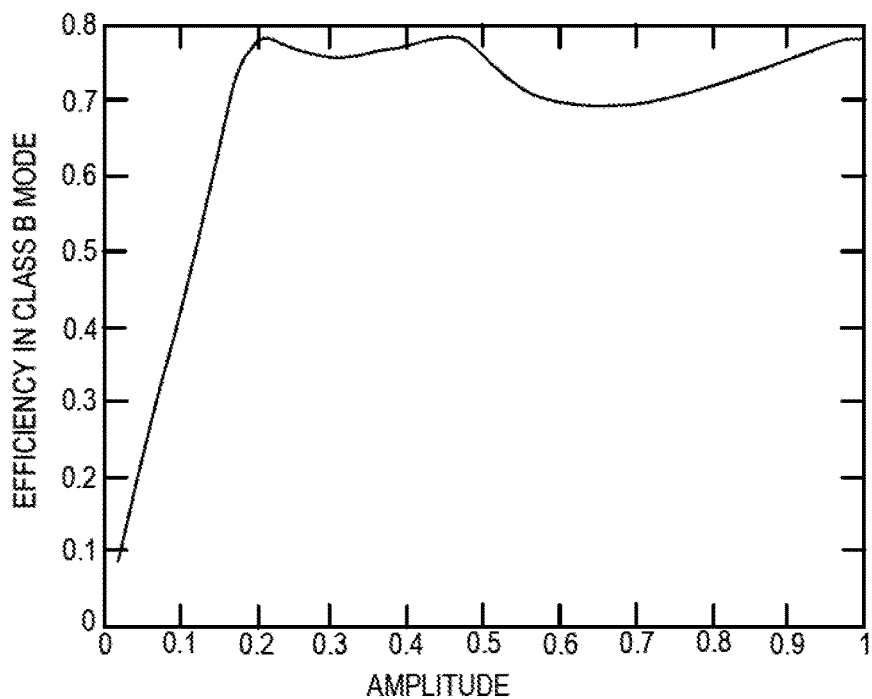
FIG. 8 shows an example efficiency curve for the amplifier circuits of FIGS. 5 and 6.

FIG. 8 shows the efficiency curve of the amplifier arrangement comprising the first amplifier 11, the second amplifier 21 and the third amplifier 31, with class B terminations and low-loss transistors. Placement of the middle efficiency peak (slightly below 0.5 of full amplitude in this example) is done primarily by the division of admittance sums between the Chireix pair of amplifier 11, 21 and the auxiliary amplifier 31 (which also reflect their power shares at full output). The lowest efficiency peak (around 0.2 of full amplitude in this example) is determined by the electrical length difference between branches. By having a smaller electric length difference (for example lengths closer to 0.25λ) between the line lengths in the Chireix pair amplifiers 11, 21 (0.22 and 0.28λ in the example), the first efficiency peak is placed at a lower output amplitude.

Figure 9:
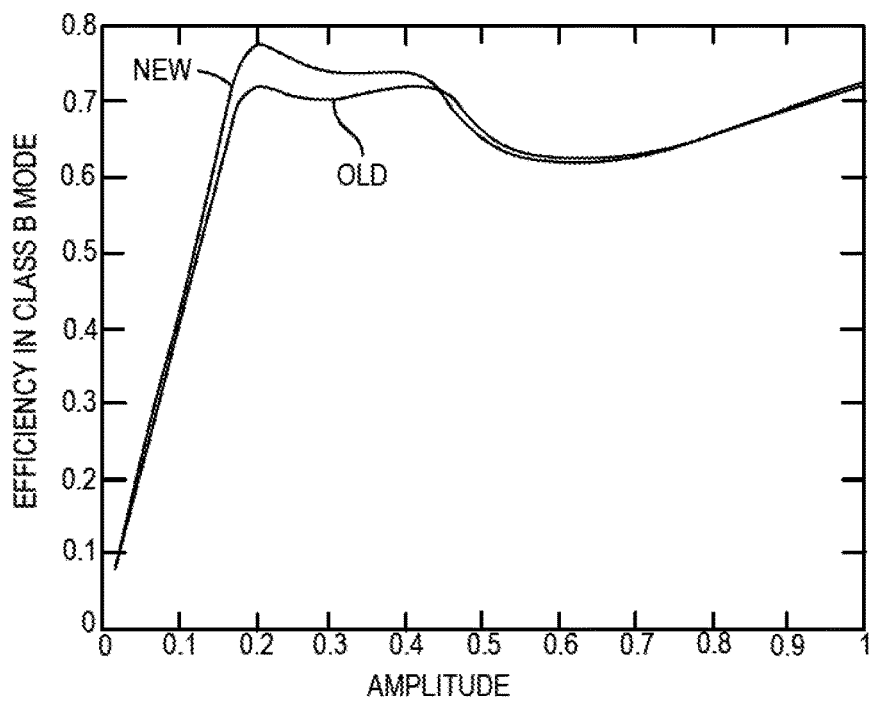
FIG. 9 compares efficiency curves for a conventional amplifier with class B terminations and low-loss transistors with an amplifier circuit according to FIGS. 5 and 6.

The low RF voltage at the auxiliary amplifier 31 means that it can be of a cheaper type with more shunt loss. For example, Gallium Nitride (GaN) amplifiers exhibit very low shunt losses, but are relatively expensive. Silicon (Si)-based amplifiers have much higher shunt losses, but are much cheaper than GaN amplifiers having comparable output powers. Because the circuit configurations shown in FIGS. 2 and 3 reduce the RF voltages at the output of the auxiliary amplifier for output powers at output powers around and below the average output power of the amplifier circuit, the effects of the shunt loss are reduced, facilitating the substitution of less expensive Si-based amplifiers where GaN devices might otherwise be required. This is illustrated in FIG. 9, in which a new amplifier arrangement as shown in FIG. 5 is compared with an old Chireix-Doherty amplifier arrangement. Both have auxiliary (peak) amplifiers (transistors) that provide half of the maximum output power, with equivalent values of shunt resistance six times the optimal load resistance at full output, i.e. Rshunt=6×Ropt. It can be seen from FIG. 8 that the efficiency in the upper amplitude range is reduced about equally for the two amplifiers, while the new amplifier has substantially better efficiency in the lowest amplitude range, i.e. below 0.45 of full output.

The example circuits shown in FIGS. 5 and 6 illustrate one technique for reducing the auxiliary amplifier output voltages at low relative amplitudes, thus improving average efficiencies for the multi-stage amplifier circuit and/or facilitating the use of lower cost devices. More particularly, this technique involves the use of an auxiliary transmission line network that splits the output of the auxiliary amplifier and joins to strategic points of the rest of the combining network.

Another technique for achieving similar results is detailed below, using several examples. This technique may be used instead of or in addition to the technique exemplified by the circuits of FIGS. 5 and 6.

The techniques described below provide new types of amplifier circuits with Chireix-Doherty-Doherty, Doherty-Chireix-Doherty and Doherty-Doherty-Chireix behavior, which at low output power levels have low sensitivity to shunt loss in the peak transistor. This is because the RF voltage swing at the peak transistor output is very low, so that its shunt loss resistance only draws very little RF current. The peak sub-amplifier in these amplifier circuits can thus both be big (have large maximum output power) and use a cheaper transistor technology.

Figure 10:
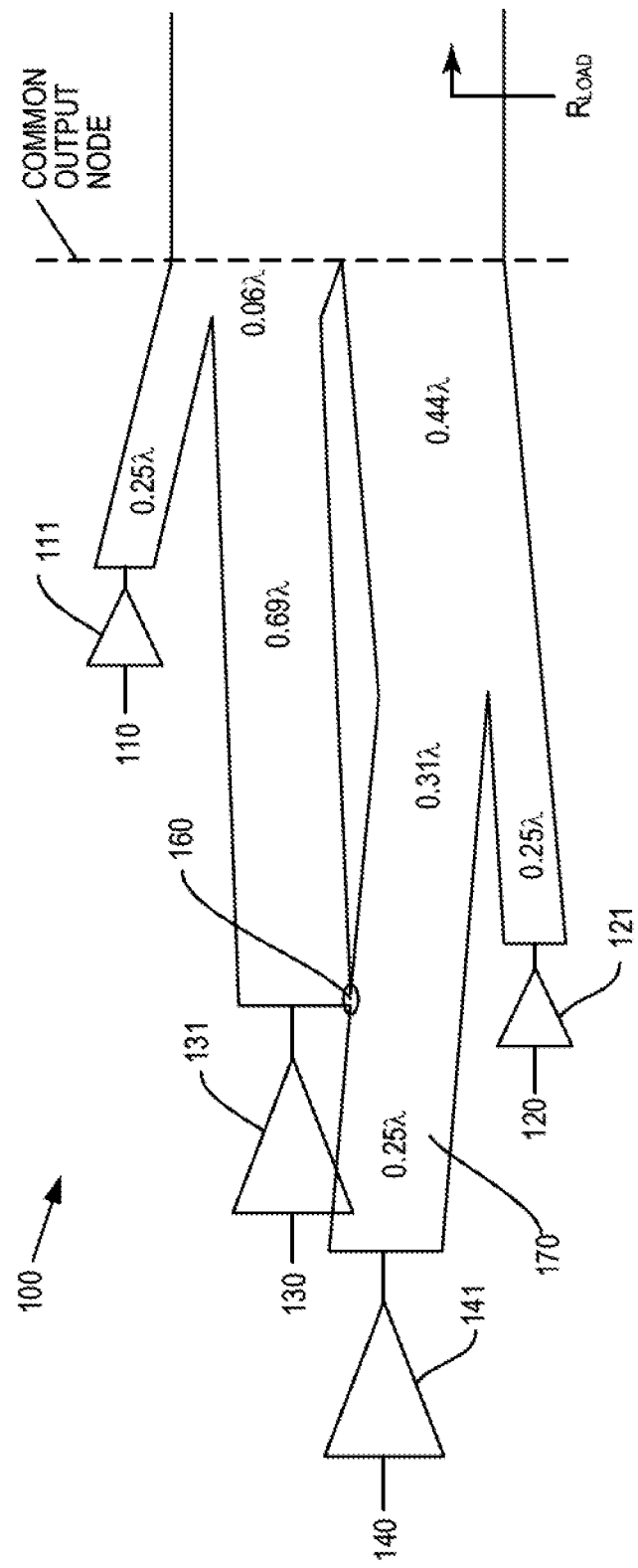
FIG. 10 shows an amplifier circuit according to an embodiment of the invention.

FIG. 10 illustrates an example of one such amplifier circuit, which extends the improved Chireix-Doherty amplifier circuit of the type shown in FIG. 5 with an extra upper range of Doherty behavior. It can be seen that the configuration shown in FIG. 10 is similar to a variant of that shown in FIG. 5, except that the amplifier 31 in FIG. 5 has been replaced with an amplifier 131 and an amplifier 141, where the output node of the amplifier 141 is coupled to the output node of the amplifier 131 with a quarter-wavelength transmission line segment 170. In other words, the peaking amplifier 31 in FIG. 5 is replaced with a new subcircuit that includes one sub-amplifier 141 at the start of a quarter-wave line 170, which transforms the output impedance of amplifier 141 to a higher impedance, and another sub-amplifier 131 at the other end (i.e., at node 160), in the position previously occupied by the peaking amplifier 31.

The amplifiers 111, 121, 131, and 141 are provided with appropriate input signals 110 and 120 so that the Chireix pair 111, 121 is operated in a Chireix mode over a low-amplitude range, e.g., from relative output amplitude levels of 0 to about 0.33. The amplifiers 131 and 141 are inactive over this amplitude range. Techniques for providing appropriate drive signals to Chireix pairs are well known; as discussed in more detail below, these techniques may be carried out at baseband or at RF, in various implementations.

For relative amplitude levels above 0.33, amplifier 141 is activated. This may be accomplished by configuring amplifier 141 for Class-C operation, for example, but may also be accomplished by providing a non-linear input signal 140, e.g., an input signal that remains at zero over a first range of desired output powers but increases linearly over the remaining range of desired output powers, by subjecting the input signal to a non-linear function at baseband or at RF. Similarly, for relative amplitude levels above about 0.5, amplifier 131 is activated. Again, this may be accomplished by configuring amplifier 131 for Class-C operation, for example, but may also be accomplished by providing a non-linear input signal 130.

Figure 11A:
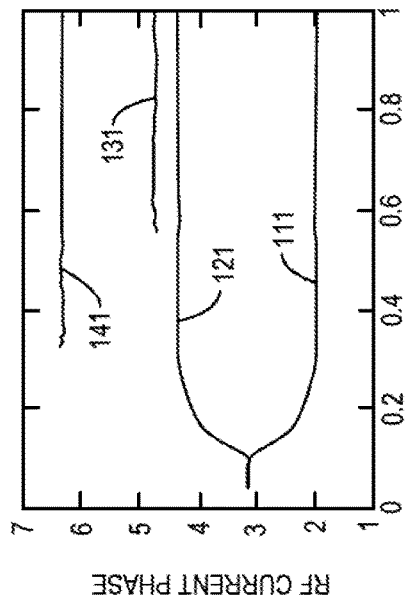
FIGS. 11A-11D illustrate the behaviors of currents and voltages for the circuit of FIG. 10.
Figure 11B:
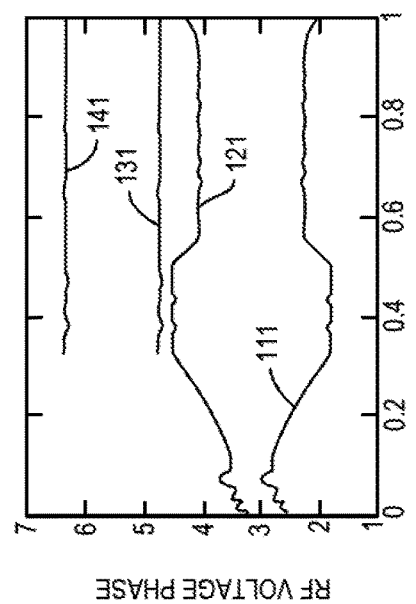
Figure 11C:
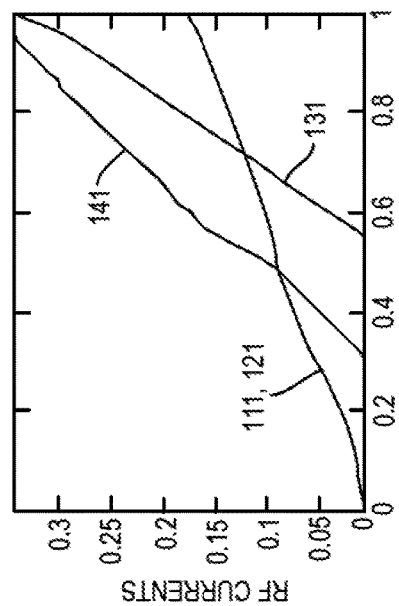
Figure 11D:
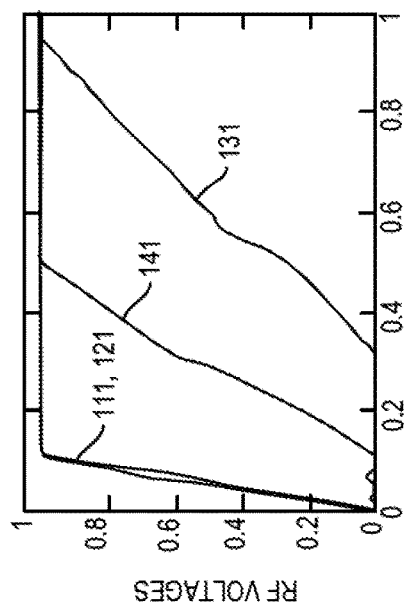
Figure 12:
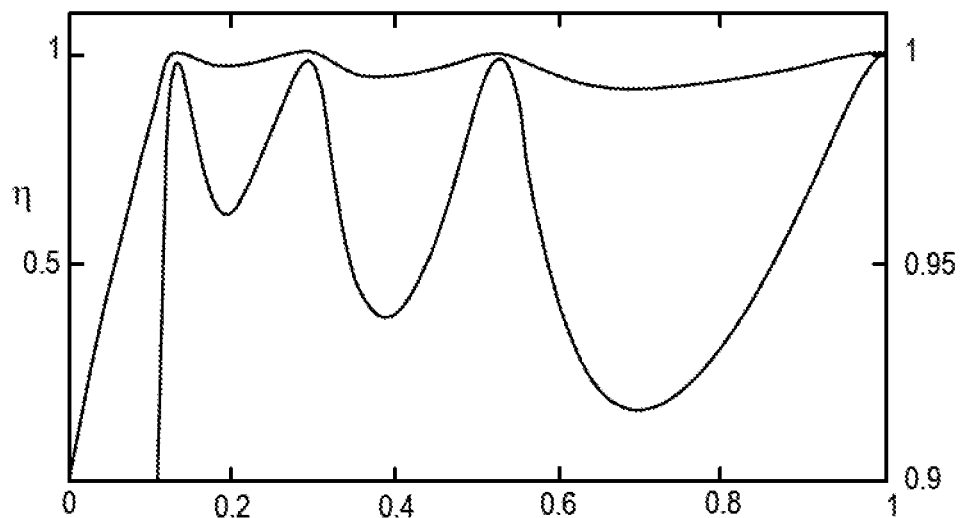
FIG. 12 shows an example efficiency curve for the amplifier circuit of FIG. 10.

FIGS. 11A-11D illustrate the resulting relative amplitudes and phases of the RF voltages and currents at the sub-amplifiers, while FIG. 12 illustrates the efficiency curve for the overall amplifier circuit. Note that the sub-amplifier sizes in this example are such that the two peak sub-amplifiers 131 and 14 each provide one-third of the circuit's maximum output power, while the remaining amplifiers 111 and 121, which operate as a Chireix pair, supply the remaining one-third.

Referring to FIGS. 11A-11D, we see that the peak sub-amplifier 131 has almost zero RF voltage below about 0.33 of maximum output amplitude, due to its voltage being a copy of the output current of the other peak sub-amplifier 141. This makes the circuit very insensitive to shunt loss at the output of amplifier 131, over the whole low-amplitude range.

Figure 13:
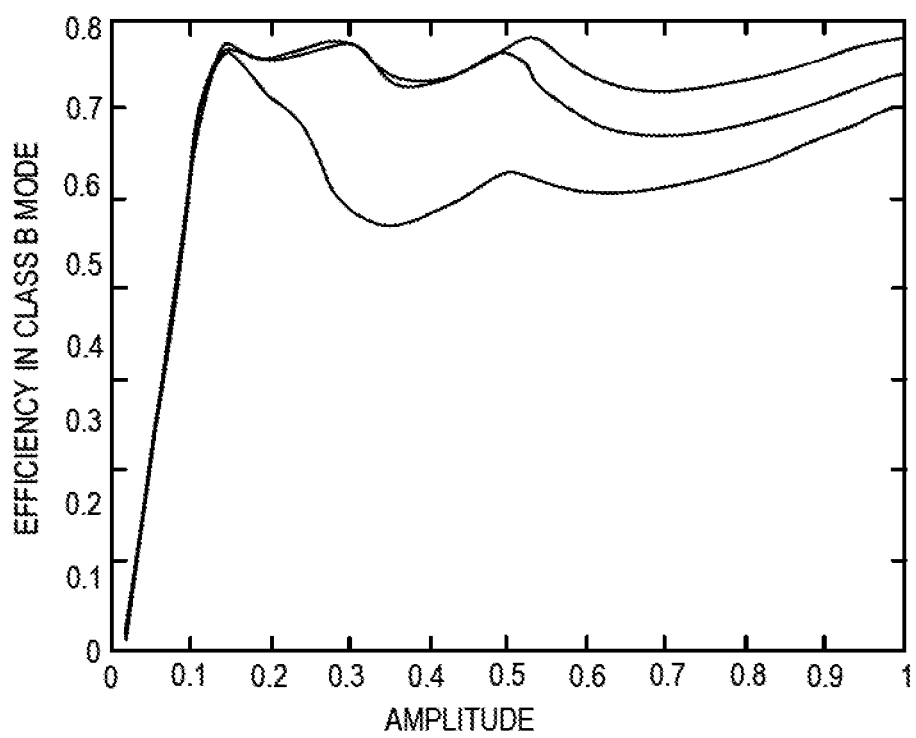
FIG. 13 compares efficiency curves for the amplifier circuit of FIG. 10, using transistors with varying shunt losses.
Figure 14:
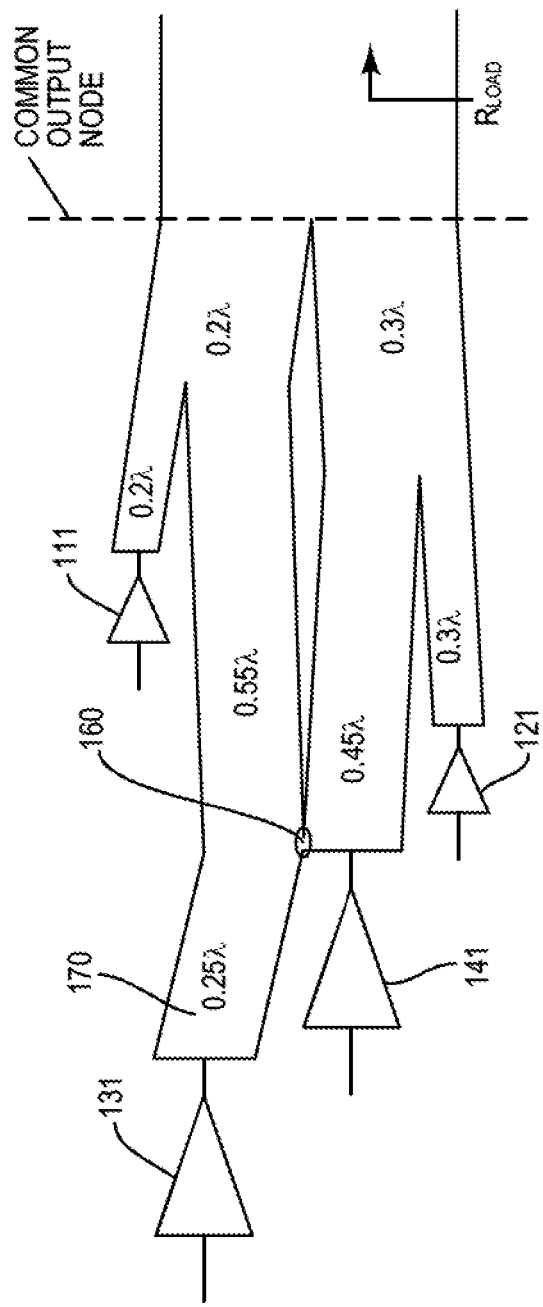
FIG. 14 shows an amplifier circuit according to an embodiment of the invention.
Figure 15B:
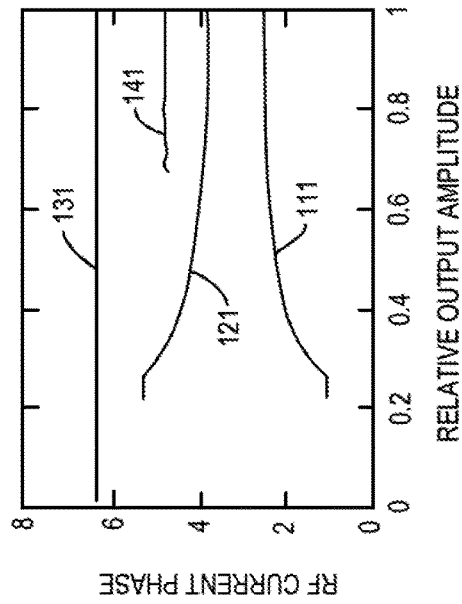
FIGS. 15A-15D illustrate the behaviors of currents and voltages for the circuit of FIG. 14.
Figure 15D:
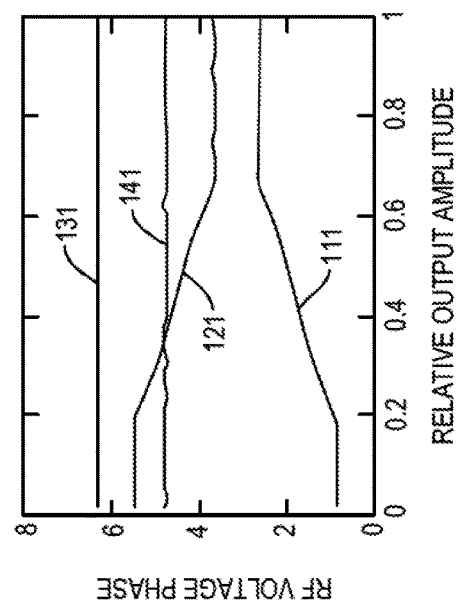
Figure 15A:
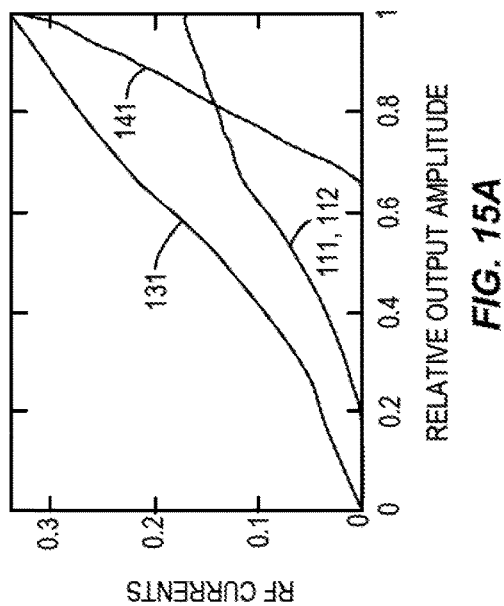
Figure 15C:
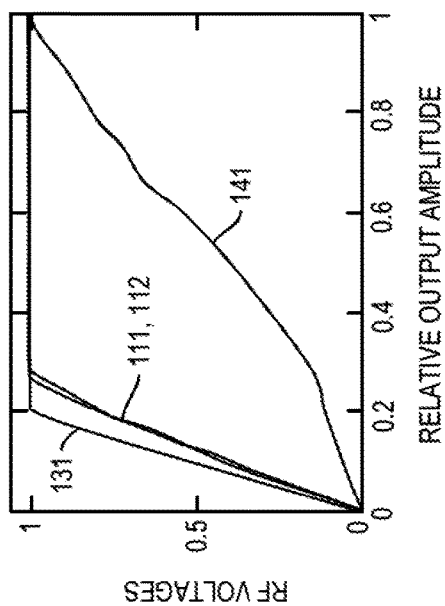
Figure 16:
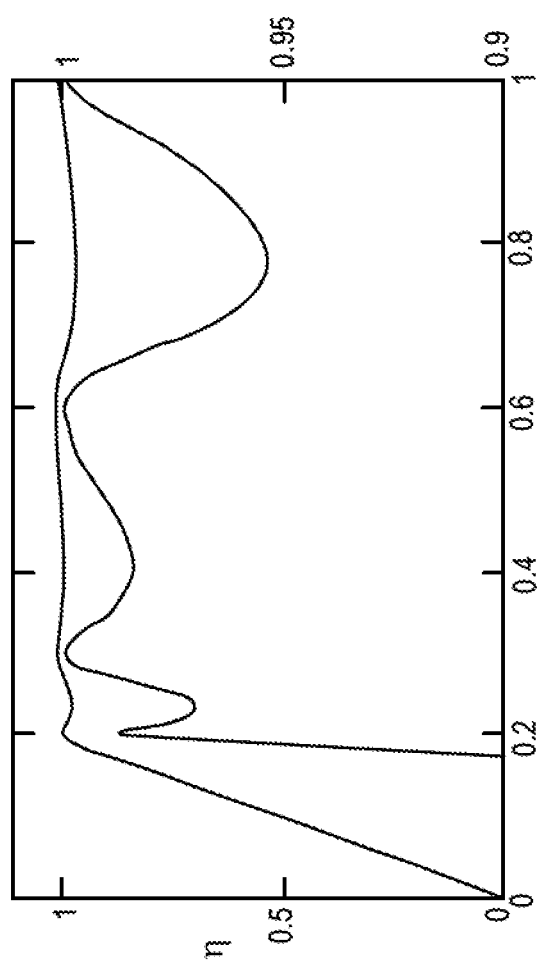
FIG. 16 shows an example efficiency curve for the amplifier circuit of FIG. 14.

FIG. 13 illustrates efficiency curves for the system that show the impact of shunt losses for various types/combinations of transistors. The top curve illustrates the efficiency for an amplifier circuit using only low-loss transistors, while the bottom curve shows the efficiency for an amplifier circuit using relatively high-loss transistors, i.e., with an equivalent shunt resistance of 6×Ropt at both peak sub-amplifiers 131 and 141. The middle curve shows the efficiency for an amplifier circuit that uses a high-loss transistor at only peak sub-amplifier 131. The system with two sub-amplifiers with high-loss transistors retains efficiency only in the lowest range, but suffers much at medium output levels due to the high RF voltage at the output of amplifier 141 in the medium output amplitude range. The system with a relatively inexpensive, high-loss, transistor only for the peak sub-amplifier 131 (with a third of the total output power capacity), however, has retained efficiency in the whole low-medium output range. This system would have largely the same efficiency as the system with all low-loss transistors, for signals with high PAR values FIG. 14 illustrates another example of a multi-stage amplifier circuit where a sub-amplifier is replaced with a pair of sub-amplifiers separated by a quarter-wavelength transmission line section. More particularly, FIG. 14 shows a modified Doherty-Chireix-Doherty amplifier circuit, in which the first stage current, from amplifier 131, follows that of a Chireix pair (amplifiers 111 and 121) in a middle amplitude range. The splitting that was done to the peaking amplifier in the previous example is now performed on the first stage amplifier. Since the first stage sub-amplifier has a sub-linear RF current, the peak sub-amplifier 141 will have a sub-linear RF voltage, which will decrease the loss at that node. The effect is not as big as in the previous example, since the voltage is not as close to zero, but the basic efficiency (without shunt loss) is higher. As a result, a better total tradeoff can be reached in some cases. FIGS. 15A-15D illustrate the resulting relative amplitudes and phases of the RF voltages and currents at the sub-amplifiers, while FIG. 16 illustrates the efficiency curve for the overall amplifier circuit.

Figure 17:
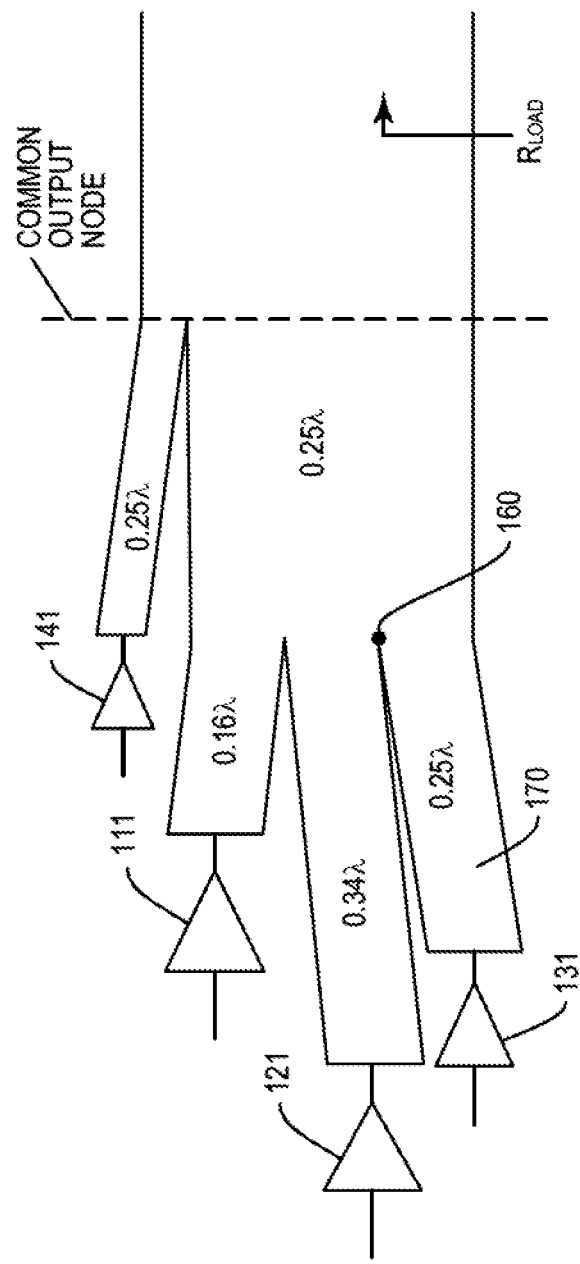
FIG. 17 shows an amplifier circuit according to an embodiment of the invention.
Figure 18B:
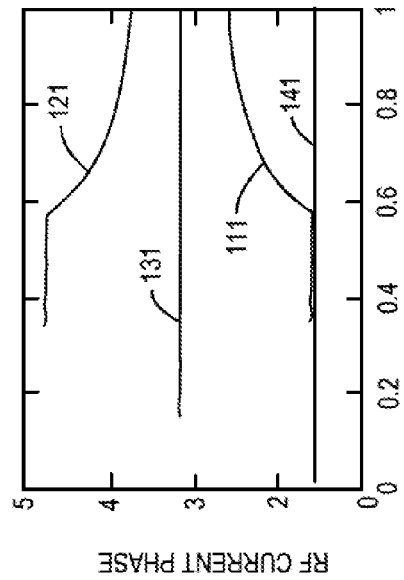
FIGS. 18A-18D illustrate the behaviors of currents and voltages for the circuit of FIG. 17.
Figure 18D:
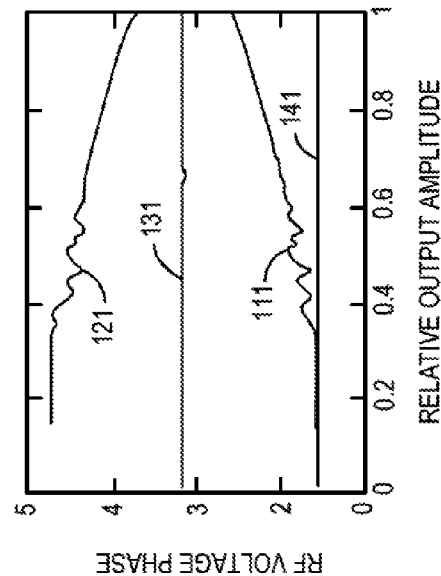
Figure 18A:
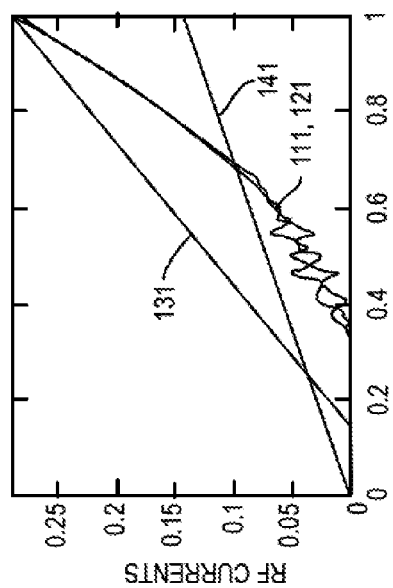
Figure 18C:
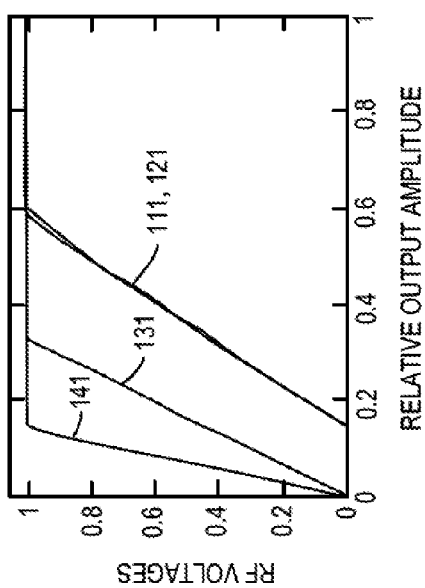
Figure 19:
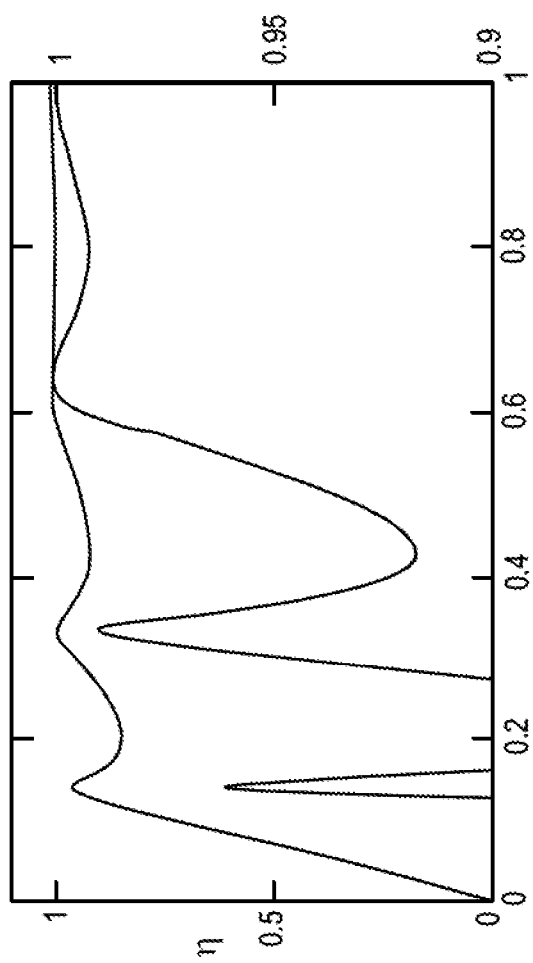
FIG. 19 shows an example efficiency curve for the amplifier circuit of FIG. 17.

The next example, shown in FIG. 17, is of a Doherty-Doherty-Chireix amplifier, in which the last peaking amplifier subcircuit is the Chireix pair 111, 121. FIGS. 18A-18D illustrate the resulting relative amplitudes and phases of the RF voltages and currents at the sub-amplifiers, while FIG. 19 illustrates the efficiency curve for the overall amplifier circuit. It will be appreciated that the current shape of the second-stage amplifier 131 is here copied to the shape of the voltage at the Chireix pair 111, 121 only for the low amplitude range. Since the Chireix pair's sub-amplifiers 111, 121 do not sit directly at the junction 160 where the second amplifier is connected (after the quarter wavelength line), the Chireix pair 111, 121 can also influence its own RF voltages in the upper range. This is necessary to get high efficiency in the upper amplitude range where the Chireix pair 111, 121 is active.

Figure 20:
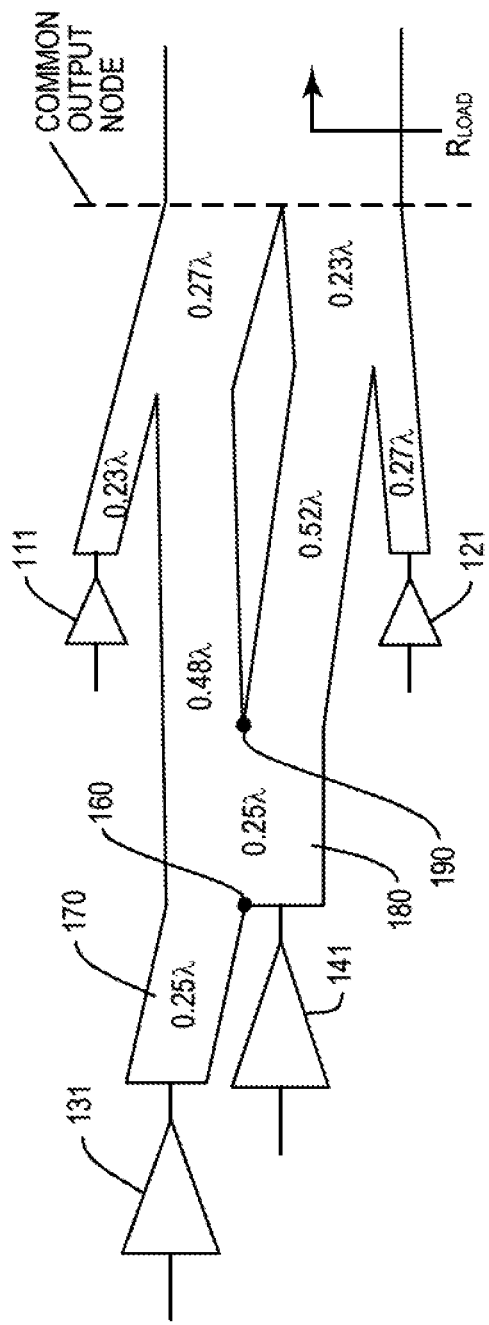
FIG. 20 shows an amplifier circuit according to an embodiment of the invention.
Figure 21B:
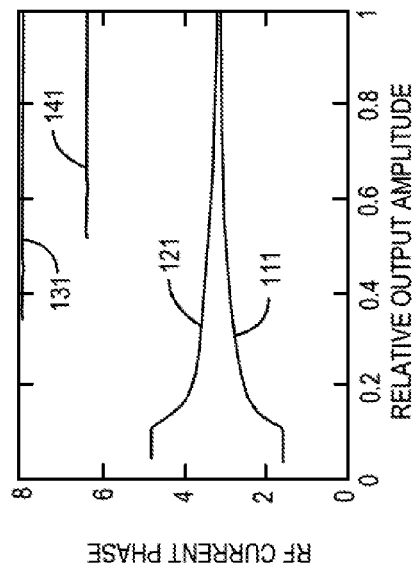
FIGS. 21A-21D illustrate the behaviors of currents and voltages for the circuit of FIG. 20.
Figure 21D:
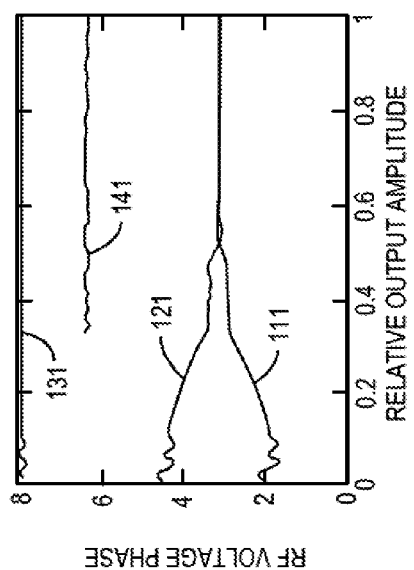
Figure 21A:
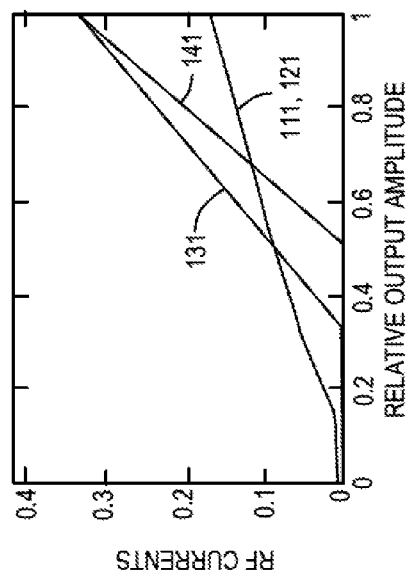
Figure 21C:
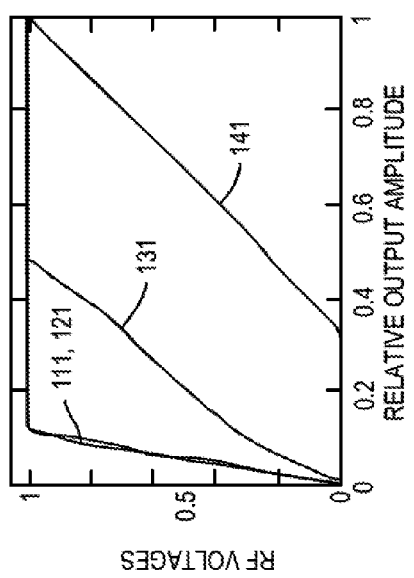
Figure 22:
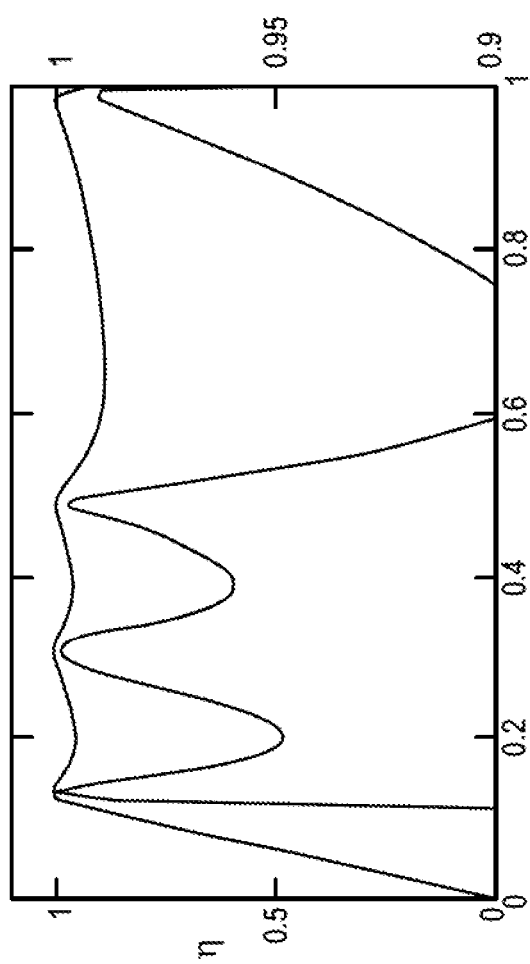
FIG. 22 shows an example efficiency curve for the amplifier circuit of FIG. 20.

If the basic 3-stage amplifier to be modified does not have a quarter-wavelength line from the peak sub-amplifier, another type of Chireix-Doherty-Doherty amplifier can be formed. To get the required quarter-wavelength line from the peaking amplifier without disturbing the basic functioning of the amplifier, add two quarter-wavelength lines from the peak sub-amplifier can be added, with the original peak sub-amplifier at the starting point and a newly inserted last peak sub-amplifier at the junction between the lines. An example of this approach is seen in FIG. 20, where an additional quarter-wavelength transmission line 180 is inserted between node 160 and node 190, the latter of which was the output node of peaking amplifier prior to modification of the circuit. FIGS. 21A-21D illustrate the resulting relative amplitudes and phases of the RF voltages and currents at the sub-amplifiers, while FIG. 22 illustrates the efficiency curve for the overall amplifier circuit.

Figure 23:
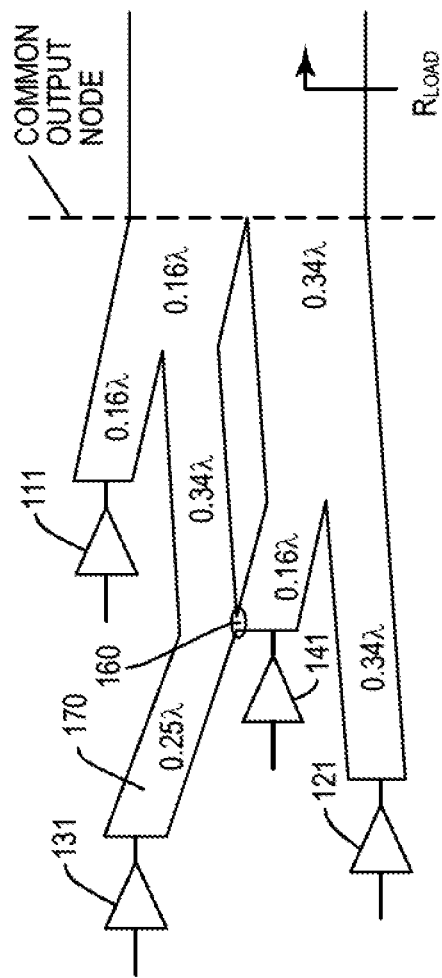
FIG. 23 shows an amplifier circuit according to an embodiment of the invention.
Figure 24B:
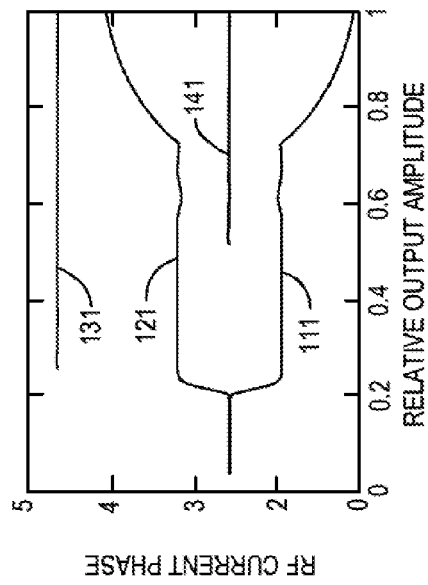
FIGS. 24A-24D illustrate the behaviors of currents and voltages for the circuit of FIG. 23.
Figure 24D:
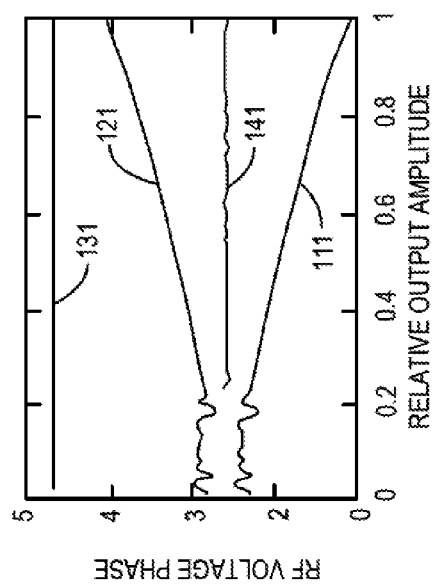
Figure 24A:
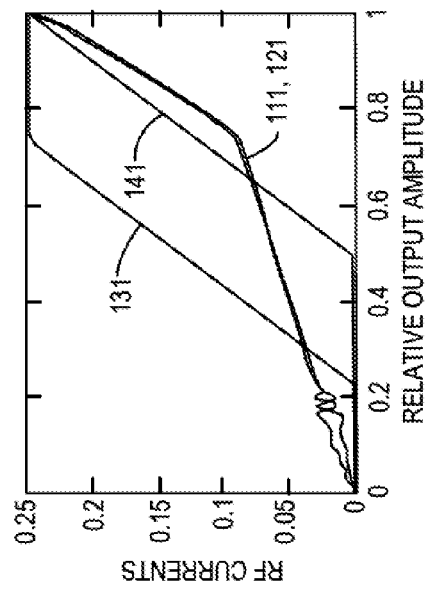
Figure 24C:
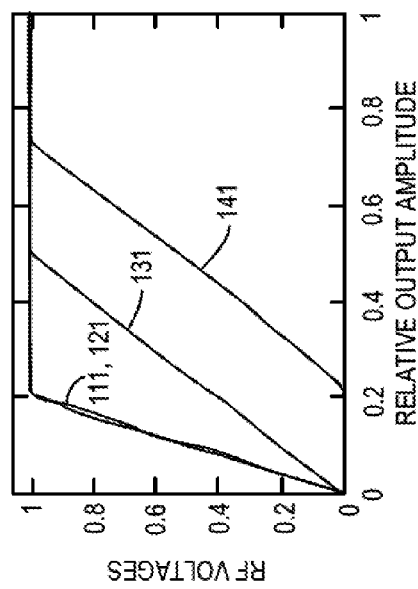
Figure 25:
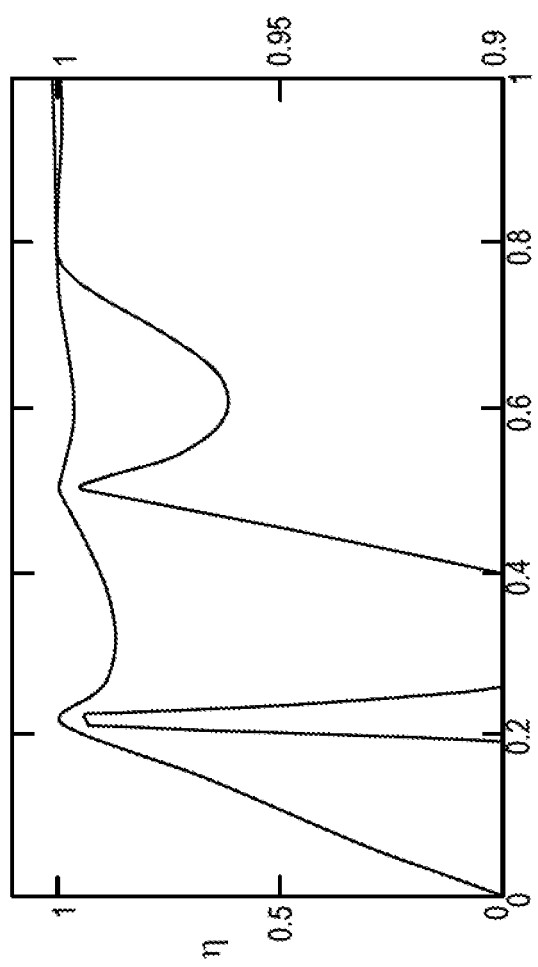
FIG. 25 shows an example efficiency curve for the amplifier circuit of FIG. 23.

Finally, to further show the general applicability of the present techniques, FIG. 23 illustrates an unorthodox Chireix-Doherty-Doherty amplifier circuit, wherein the out-phasing behaviour of the starting Chireix pair 111,121 is placed in the uppermost amplitude range. The last peak sub-amplifier 141 has here a voltage shape that is a copy of the output current shape from the first peak sub-amplifier 131. FIGS. 24A-24D illustrate the resulting relative amplitudes and phases of the RF voltages and currents at the sub-amplifiers, while FIG. 25 illustrates the efficiency curve for the overall amplifier circuit.

While the details of the circuits shown in FIGS. 10, 14, 17, 20, and 23 vary, these circuits share several features that, together, provide a multi-stage amplifier circuit having improved efficiency at lower output amplitudes when amplifying signals having a high PAR. In particular, each of the illustrated amplifier circuits includes three amplifier subcircuits where one of the amplifier subcircuits is a Chireix pair. (Variants where more than one of the subcircuits is a Chireix pair are possible, of course.) The output nodes of these three amplifier subcircuits are connected, via a network of transmission lines, to a common output node, which is in turn connected to a load. Note that the output node of the amplifier subcircuit that comprises a Chireix pair is the point where the outputs of the two amplifiers of the pair come together, closest to the common output node.

Figure 26:
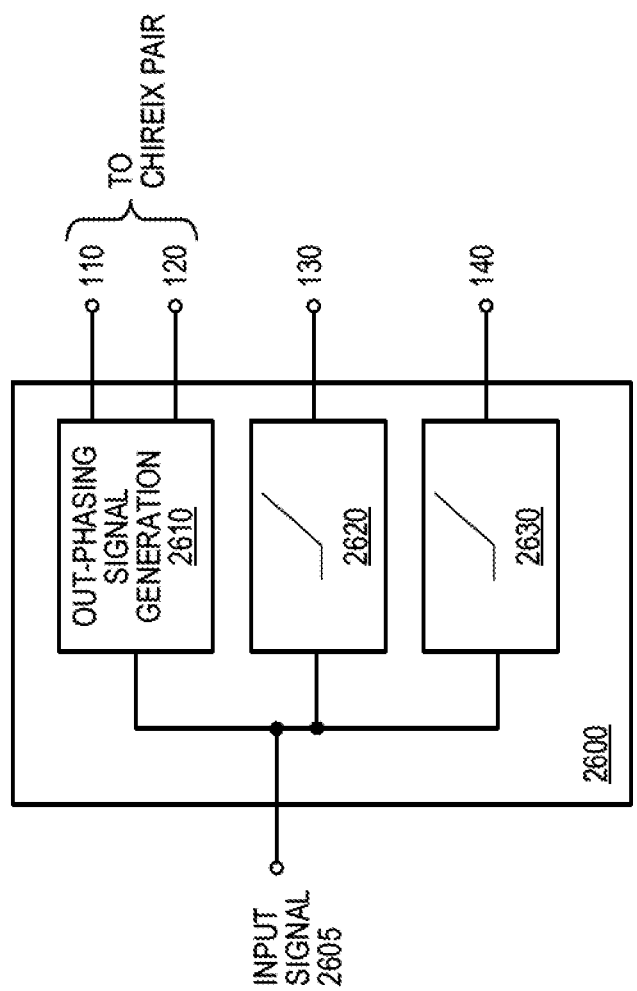
FIG. 26 illustrates a signal generation circuit according to embodiments of the present invention.

While a signal generation circuit is not illustrated in FIGS. 10, 14, 17, 20 and 23, it will be understood that such a circuit is needed to produce appropriate input signals to each of the amplifier subcircuits. FIG. 26 is a block diagram that illustrates the principal components of a signal generation circuit 2600 that can be combined directly with any of the amplifier configurations shown in FIGS. 10, 14, 17, 20, and 23.

Signal generation circuit 2600 includes an out-phasing signal generation circuit 2610 that produces, from the input signal 2605, appropriately out-phased input signals 110 and 120 for input to the amplifier subcircuits 111 and 121, which make up a Chireix pair. Because the amplifier subcircuits generally operate as controlled current sources, the outputs from out-phasing signal generation circuit 2610 should generally mirror the desired output RF currents and RF current phases for the amplifier subcircuits 111 and 121. (For the amplifier configuration of FIG. 10, these are shown in FIGS. 11A and 11B, for example.) However, the out-phasing signal generation circuit 2610 may account for anticipated non-linearities in the transconductances of the amplifier subcircuits, in some embodiments. In some embodiments, such as with the circuit configuration shown in FIG. 10, the Chireix pair 111, 121 is active for the entire range of desired output amplitudes, in which case the signals 110 and 120 are non-zero for the entire range of the amplifier circuit's operation. In others, such as with the circuit configuration shown in FIG. 14, the Chireix pair 111, 121 is active for only a part of the range of desired output amplitudes. In these embodiments, the out-phasing signal generation circuit 2610 should incorporate a non-linear function, such that the signals 110 and 120 remain at zero over a pre-determined portion of the range of desired output amplitudes.

Non-linear circuits 2620 and 2630 subject the input signal 2605 to a non-linear function so that the resulting signals 130 and 140, which are input to amplifier sub-circuits 131 and 141, respectively, remain at zero over a pre-determined portion of the range of desired output amplitudes for the amplifier circuit. When coupled with the amplifier configuration shown in FIG. 10, for example, non-linear circuit 2620 has an output of zero for relative output amplitudes ranging from 0 to about 0.5, for example. Above 0.5, signal 130 increases linearly from zero to a maximum level at a relative output amplitude of 1.0. Similarly, non-linear circuit 2630 has an output of zero for relative output amplitudes ranging from 0 to about 0.33, for example. Above 0.33, signal 140 increases linearly from zero to a maximum level at a relative output amplitude of 1.0. Again, because the amplifier subcircuits act as controlled current sources, the outputs from non-linear circuits 2620 and 2630 should generally mirror the desired output RF currents and RF current phases for their corresponding amplifier subcircuits. However, the non-linear circuits 2620 and 2630 may account for anticipated non-linearities in the transconductances of the amplifier subcircuits, in some embodiments.

Figure 27:
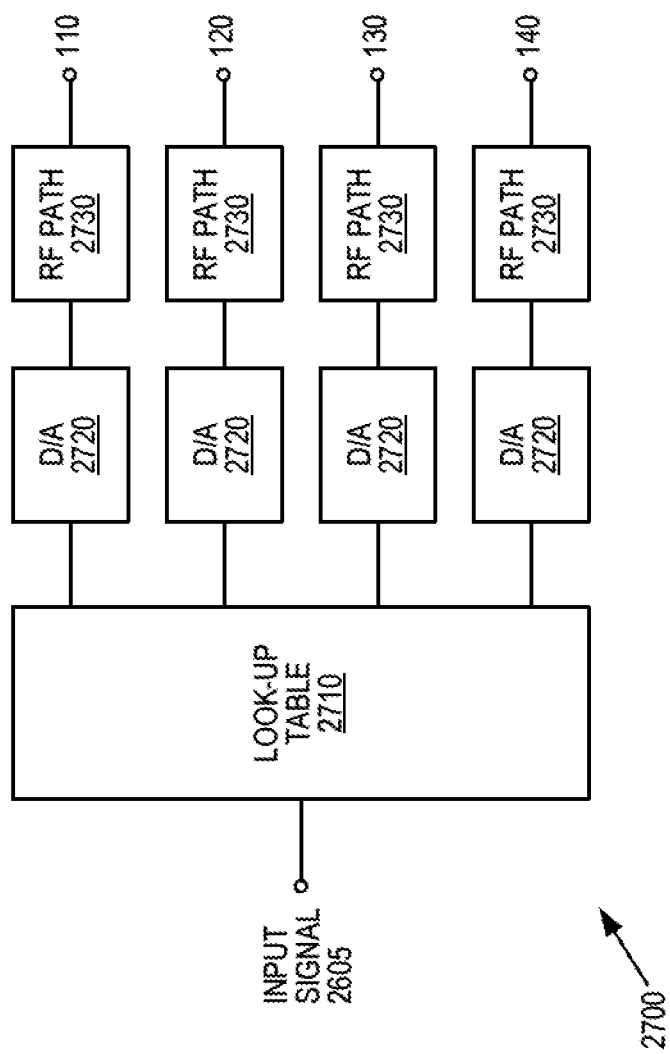
FIG. 27 illustrates further details of an example signal generation circuit.

The out-phasing signal generation circuit 2610 and non-linear circuits 2620 and 2630 may be implemented at baseband frequencies or at RF frequencies, in various embodiments. In some embodiments, it may be particularly advantageous to implement signal generation circuit 2600 at baseband, using digital circuitry. FIG. 27 illustrates an example of such an implementation. In this implementation, input signal 2605 is a baseband digital input signal, which is forwarded to a vector look-up table 2710. Each single input signal value generates an output signal vector, with each component of the output signal vector corresponding to a drive signal for one of the amplifier subcircuits. The look-up table incorporates the out-phasing signal generation and non-linear functions discussed above. The output signal vector is supplied to parallel digital-to-analog (D/A) converters 2720, and the resulting analog signals supplied to separate RF paths 2730 before being supplied to their respective amplifier subcircuit inputs.

It will be appreciated that the signal generation circuits 2600 shown in FIGS. 26 and 27 may be adapted to produce appropriate input signals for any of the amplifier configures shown in FIGS. 10, 14, 17, 20, and 23, and variations thereof. When a signal generation circuit like those shown in FIG. 26 or 27 is combined with any of these amplifier configurations, the result is that the amplifier subcircuits described in detail above operate in first, second, and third operating modes, as a function of a desired output power at the common node, such that a first one of the amplifier subcircuits is active in all three operating modes, a second one of the amplifier subcircuits is inactive in the first operating mode and active in the second and third modes, and the remaining amplifier subcircuit is inactive in the first and second modes and active in the third.

In each of these amplifier circuits, a transmission line segment having an electrical length of approximately one-quarter wavelength (or any odd multiple thereof) at an operating frequency of the multi-stage amplifier couples either the output node of the first amplifier subcircuit or the output node of the second amplifier subcircuit to the output node of the third amplifier subcircuit, and wherein the output node of the remaining one of the first and second amplifiers circuits is coupled to a point between the common node and the output node of the third amplifier subcircuit but electrically distant from the output node of the third amplifier subcircuit. "Electrically distant" means that there is a non-trivial phase shift between the two points, relative to a nominal operating frequency for the amplifier circuit, such as would be obtained from a transmission line segment or a lumped element in series between the two points. FIGS. 10, 17, 20, and 23 are examples of a circuit in which the transmission line segment couples the output node of the first amplifier subcircuit to the output node of the third amplifier subcircuit, while FIG. 14 shows a circuit in which the transmission line segment couples the output node of the second amplifier subcircuit to the output node of the third amplifier subcircuit. (The first and second amplifier subcircuits are distinguished by the operating modes in which they are active/inactive.)

It should be appreciated that any of the amplifier subcircuits referred to in the generalized description immediately above may itself comprise more than one transistor amplifier subcircuit. Thus, amplifier circuits having a higher order than those illustrated herein (i.e., having more sub-amplifiers and operational stages) that use the techniques described above can be made in a similar fashion. A basic principle behind these techniques is that there exists an (approximately) quarter-wavelength line from a sub-amplifier that has a low output current in a low or medium amplitude range. A peak sub-amplifier placed at the other end of the quarter-wavelength line will then have a low RF voltage amplitude in that range. In the event that the required quarter-wavelength line (or equivalent circuit) does not exist in the starting point for the design, the same behavior can usually be achieved by adding two quarter-wavelength lines, with the original sub-amplifier at the starting point and the newly inserted last peak sub-amplifier at the junction between the lines.

It is noted that the structures in the various embodiments described above can be modified to accommodate other sizes of transistors, for example making the auxiliary transistor bigger or smaller. The characteristic impedances of the transmission lines (or their equivalent circuits) can then be adjusted accordingly, so that the amplifiers can all deliver their maximum output power during signal peaks. According to one embodiment, a general rule for maximizing output power is to have all transmission line impedances in the output network approximately equal to the Ropt of the sub-amplifier (transistor amplifier circuit) it is connected to, where Ropt is the load resistance that yields the maximum output power from the transistor and is generally defined as Vmax/Imax, where Vmax is the maximum RF voltage swing and Imax is the maximum RF current swing. In junctions, the sum of admittance (inverse of impedance) of the lines on each side can be made equal, i.e., when two lines join, and wherein the outgoing line has a characteristic impedance equal to that of the parallel coupling of the incoming lines. t is noted that for all the transmission lines shown in the example embodiments above, these can be replaced by equivalent circuits such as combinations of lumped elements. For example, the quarter-wavelength lines can be replaced by LC, pi- or T-networks with reactances equal in magnitude to the characteristic impedance of the replaced quarter wave line. T networks, L networks, single or in cascade can also be used.

It will be appreciated that transistors in general act as controlled RF current sources, so the shape of the amplitudes and phases (relative to that of the output) of the RF currents as functions of the output amplitude also suggest the desired voltage shaping that can be performed to the input signals (gate drive voltages). The actual shapes can take into account that the voltage-to-current conversion (transconductance) in the transistors is more or less nonlinear, and that the RF voltage swing can influence the output current as well (especially via saturation when close to the upper limit).

The several embodiments of an amplifier circuit described above provide a new type of amplifier circuit with Chireix-Doherty behaviour, which, at low output power levels, has extremely low sensitivity to shunt loss in the peak (auxiliary) transistor. The auxiliary transistor can thus both be big and use a cheaper transistor technology, and the amplifier will still have high average efficiency. Substantially increased peak power can therefore be obtained without the need to use expensive transistors. The problems usually associated with peak reduction, such as increased EVM, increased average output power, increased DC power consumption, and increased need for cooling, can therefore be mitigated without drawbacks.

Figure 28:
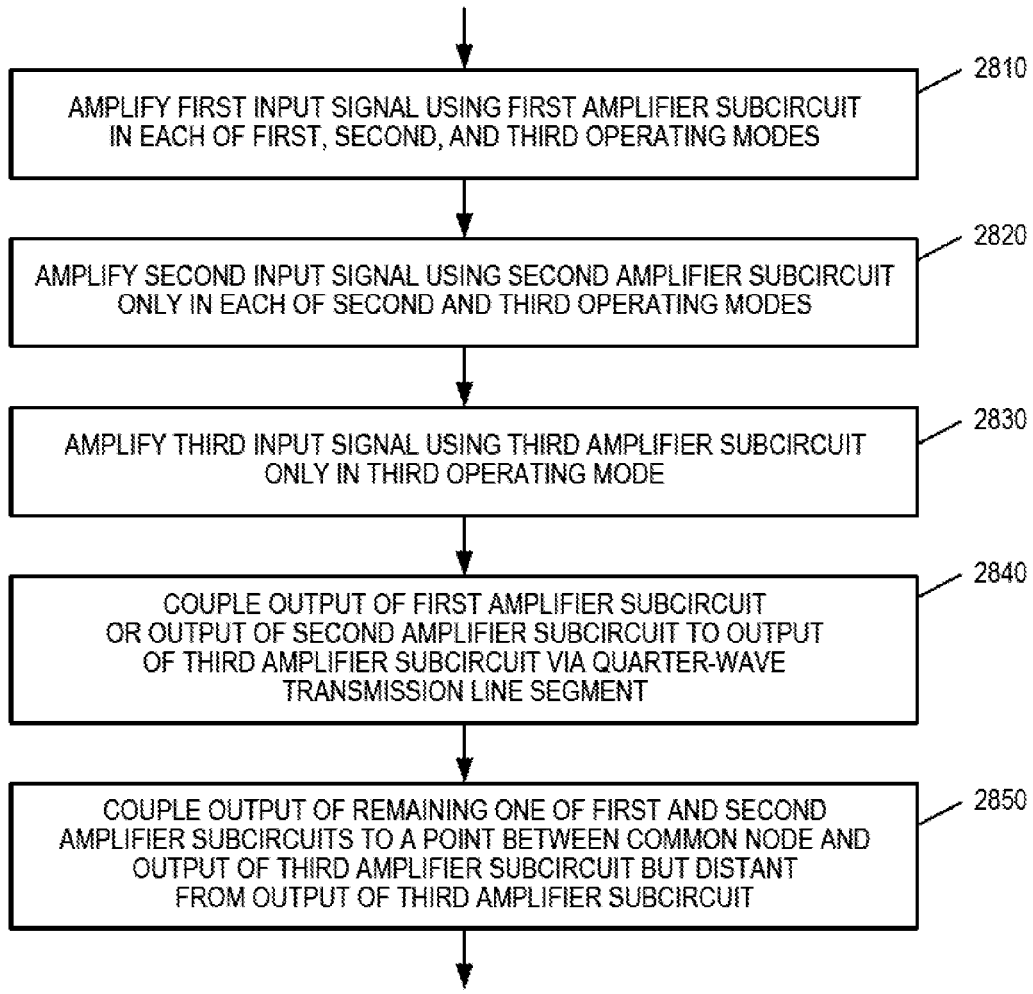
FIG. 28 shows a method according to another embodiment of the invention.

It will be further appreciated that embodiments of the presently disclosed techniques includes methods for amplifying input signals using any of the multi-stage amplifier circuits described above. FIG. 28 illustrates an example method, suitable for implementation in a multi-stage amplifier circuit comprising three amplifier subcircuits having respective output nodes connected via a network of transmission lines to a common output node, where at least one of the three amplifier subcircuits comprises a Chireix pair. Note that the method may be implemented with any of the circuits shown in FIGS. 10, 14, 17, 20, and 23, as well as variants of those circuits.

As shown at block 2810, the illustrated method includes amplifying a first input signal, using the first amplifier subcircuit, in each of first, second, and third operating modes. As seen at block 2820, the method further includes amplifying a second input signal, using the second amplifier subcircuit, in the second and third operating modes, but deactivating the second amplifier subcircuit in the first operating mode. As shown at block 2830, the method still further includes amplifying a third input signal, using the third amplifier subcircuit, in the third operating mode, but deactivating the third amplifier subcircuit in the first and second operating modes.

The method further comprises coupling either the output node of the first amplifier subcircuit or the output node of the second amplifier subcircuit to the output node of the third amplifier subcircuit via a transmission line segment having an electrical length approximately equal to an odd multiple of one-quarter wavelength at an operating frequency of the multi-stage amplifier, as shown at block 2840, and coupling the output node of the remaining one of the first and second amplifiers circuits to a point between the common output node and the output node of the third amplifier subcircuit but electrically distant from the output node of the third amplifier subcircuit, as shown at block 2850.

It is noted that the amplifier circuits and methods described in the embodiments of the invention may be used in any terminal of a telecommunications network including, but not limited to, radio base stations or eNodeBs (or other similar nodes in other telecommunication platforms), mobile or portable terminals, or any other device which requires a wideband amplifier with good efficiency across the bandwidth. Although the embodiments of the invention have been described in relation to a telecommunications environment, the embodiments of the invention may also be used with any application whereby a wideband amplifier is required with good efficiency across the bandwidth, including non-telecommunication applications.

Finally, it should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

What is claimed is:

1. A multi-stage amplifier circuit, comprising:
three amplifier subcircuits having respective output nodes connected via a network of transmission lines to a common output node, at least one of the three amplifier subcircuits comprising a Chireix pair; and
a signal generation circuit configured to provide input signals to the three amplifier subcircuits so that the amplifier subcircuits operate in first, second, and third operating modes, as a function of a desired output power at the common output node, such that a first amplifier subcircuit is active in the first, second, and third operating modes, a second amplifier subcircuit is inactive in the first operating mode but active in the second and third operating modes, and a third amplifier subcircuit is inactive in the first and second operating modes but active in the third operating mode;
wherein a first transmission line segment having an electrical length approximately equal to an odd multiple of one-quarter wavelength at an operating frequency of the multi-stage amplifier couples either the output node of the first amplifier subcircuit or the output node of the second amplifier subcircuit to the output node of the third amplifier subcircuit, and wherein the output node of the remaining one of the first and second amplifiers circuits is coupled to a point between the common output node and the output node of the third amplifier subcircuit but electrically distant from the output node of the third amplifier subcircuit.

2. The multi-stage amplifier circuit of claim 1, wherein the third amplifier subcircuit has an output shunt resistance that is substantially lower than the output shunt resistance of the amplifier subcircuit that is coupled to the output node of the third amplifier subcircuit via the first transmission line segment.

3. The multi-stage amplifier of claim 1, wherein:
the first transmission line segment couples the output node of the second amplifier subcircuit to the output node of the node of the third amplifier subcircuit;
the first amplifier subcircuit comprises first and second amplifiers, configured for operation as a Chireix pair;
the first amplifier is configured to amplify a first input signal and has an output coupled to the common node via a first transmission line, the first transmission line comprising a first portion having a first characteristic impedance and a first length, and a second portion having a second characteristic impedance and a second length;
the second amplifier is configured to amplify a second input signal and has an output coupled to the common output node via a second transmission line, the second transmission line comprising a first portion having a first characteristic impedance and a first length, and a second portion having a second characteristic impedance and a second length; and
the output node of the third amplifier subcircuit is coupled via an auxiliary transmission line network to a first intersection between the first and second portions of the first transmission line, and to a second intersection between the first and second portions of the second transmission line.

4. The multi-stage amplifier circuit of claim 3, wherein the third amplifier subcircuit has an output shunt resistance that is substantially lower than the output shunt resistance of the amplifier subcircuit that is coupled to the output node of the third amplifier subcircuit via the first transmission line segment.

5. The multi-stage amplifier of claim 1, wherein:
the first transmission line segment couples the output node of the first amplifier subcircuit to the output node of the node of the third amplifier subcircuit;
the second amplifier subcircuit comprises first and second amplifiers, configured for operation as a Chireix pair;
the first amplifier is configured to amplify a first input signal and has an output coupled to the common node via a first transmission line, the first transmission line comprising a first portion having a first characteristic impedance and a first length, and a second portion having a second characteristic impedance and a second length;
the second amplifier is configured to amplify a second input signal and has an output coupled to the common output node via a second transmission line, the second transmission line comprising a first portion having a first characteristic impedance and a first length, and a second portion having a second characteristic impedance and a second length; and
the output node of the first amplifier subcircuit is coupled via an auxiliary transmission line network to a first intersection between the first and second portions of the first transmission line, and to a second intersection between the first and second portions of the second transmission line.

6. The multi-stage amplifier circuit of claim 5, wherein the third amplifier subcircuit has an output shunt resistance that is substantially lower than the output shunt resistance of the amplifier subcircuit that is coupled to the output node of the third amplifier subcircuit via the first transmission line segment.

7. The multi-stage amplifier of claim 1, wherein:
the transmission line segment couples the output node of the second amplifier subcircuit to the output node of the node of the third amplifier subcircuit;
the third amplifier subcircuit comprises first and second amplifiers, configured for operation as a Chireix pair; and
the output nodes of the third amplifier subcircuit and the first amplifier subcircuit are coupled to the common output node via second and third transmission line segments, respectively.

8. The multi-stage amplifier circuit of claim 7, wherein the third amplifier subcircuit has an output shunt resistance that is substantially lower than the output shunt resistance of the amplifier subcircuit that is coupled to the output node of the third amplifier subcircuit via the first transmission line segment.

9. The multi-stage amplifier of claim 1, wherein:
the first transmission line segment couples the output node of the second amplifier subcircuit to the output node of the node of the third amplifier subcircuit;
the first amplifier subcircuit comprises first and second amplifiers, configured for operation as a Chireix pair;
the first amplifier has an output coupled to the common node via a first transmission line, the first transmission line comprising a first portion having a first characteristic impedance and a first length, and a second portion having a second characteristic impedance and a second length;
the second amplifier has an output coupled to the common output node via a second transmission line, the second transmission line comprising a first portion having a first characteristic impedance and a first length, and a second portion having a second characteristic impedance and a second length; and
the output node of the third amplifier subcircuit is coupled via a second quarter-wavelength transmission line segment in series with an auxiliary transmission line network to a first intersection between the first and second portions of the first transmission line, and to a second intersection between the first and second portions of the second transmission line.

10. The multi-stage amplifier circuit of claim 9, wherein the third amplifier subcircuit has an output shunt resistance that is substantially lower than the output shunt resistance of the amplifier subcircuit that is coupled to the output node of the third amplifier subcircuit via the first transmission line segment.

11. A method in a multi-stage amplifier circuit comprising three amplifier subcircuits having respective output nodes connected via a network of transmission lines to a common output node, at least one of the three amplifier subcircuits comprising a Chireix pair, the method comprising:
amplifying a first input signal, using the first amplifier subcircuit, in each of first, second, and third operating modes;
amplifying a second input signal, using the second amplifier subcircuit, in the second and third operating modes, but deactivating the second amplifier subcircuit in the first operating mode;
amplifying a third input signal, using the third amplifier subcircuit, in the third operating mode, but deactivating the third amplifier subcircuit in the first and second operating modes;
coupling either the output node of the first amplifier subcircuit or the output node of the second amplifier subcircuit to the output node of the third amplifier subcircuit via a transmission line segment having an electrical length approximately equal to an odd multiple of one-quarter wavelength at an operating frequency of the multi-stage amplifier; and
coupling the output node of the remaining one of the first and second amplifiers circuits to a point between the common output node and the output node of the third amplifier subcircuit but electrically distant from the output node of the third amplifier subcircuit.

* * * * *